United States Patent
Hashimoto et al.

(10) Patent No.: US 11,521,854 B2
(45) Date of Patent: Dec. 6, 2022

(54) PROCESSING LIQUID SUPPLY SYSTEM, PROCESSING LIQUID SUPPLY APPARATUS, AND CARRIER STORAGE APPARATUS

(71) Applicant: Tokyo Electron Limited, Tokyo (JP)

(72) Inventors: Kazuya Hashimoto, Kumamoto (JP); Hikaru Akada, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 216 days.

(21) Appl. No.: 16/760,480

(22) PCT Filed: Oct. 31, 2018

(86) PCT No.: PCT/JP2018/040567
§ 371 (c)(1),
(2) Date: Apr. 30, 2020

(87) PCT Pub. No.: WO2019/088189
PCT Pub. Date: May 9, 2019

(65) Prior Publication Data
US 2020/0357630 A1    Nov. 12, 2020

(30) Foreign Application Priority Data
Nov. 1, 2017 (JP) .............................. JP2017-211984

(51) Int. Cl.
*H01L 21/027* (2006.01)
*B05D 1/32* (2006.01)
(Continued)

(52) U.S. Cl.
CPC .............. *H01L 21/027* (2013.01); *B05D 1/32* (2013.01); *G03F 1/66* (2013.01); *H01L 21/67023* (2013.01)

(58) Field of Classification Search
CPC ............ H01L 21/027; H01L 21/67023; H01L 21/67017; H01L 21/6715; B05D 1/32; G03F 1/66; G03F 7/16; G03F 7/30
(Continued)

(56) References Cited

U.S. PATENT DOCUMENTS

2015/0078870 A1* 3/2015 Dauendorffer ......... B65D 47/04
222/189.1
2015/0096682 A1* 4/2015 Nakashima ............. G03F 7/162
414/217

FOREIGN PATENT DOCUMENTS

JP          2017-076669 A      4/2017

OTHER PUBLICATIONS

International Search Report dated Jan. 15, 2019 for WO 2019/088189 A1 (4 pages).

* cited by examiner

*Primary Examiner* — Vu A Vu
(74) *Attorney, Agent, or Firm* — Venjuris, P.C.

(57) ABSTRACT

A processing liquid supply system includes: a processing liquid supply apparatus including a first carrier accommodation section that accommodates a carrier, a first bottle accommodation section that accommodates a processing liquid bottle taken out from the carrier, a liquid feeding section that feeds a processing liquid to a substrate processing apparatus from the processing liquid bottle, and a first transfer arm; and a control device configured to control the first transfer arm to take a processing liquid bottle out from the carrier and transfer the processing liquid bottle to the first bottle accommodation section, to transfer the processing liquid bottle from the first bottle accommodation section to the liquid feeding section, and to transfer the consumed processing liquid bottle from the liquid feeding arm and
(Continued)

accommodate the consumed processing liquid bottle in the carrier.

13 Claims, 13 Drawing Sheets

(51) Int. Cl.
*G03F 1/66* (2012.01)
*H01L 21/67* (2006.01)
(58) Field of Classification Search
USPC .......................................................... 118/679
See application file for complete search history.

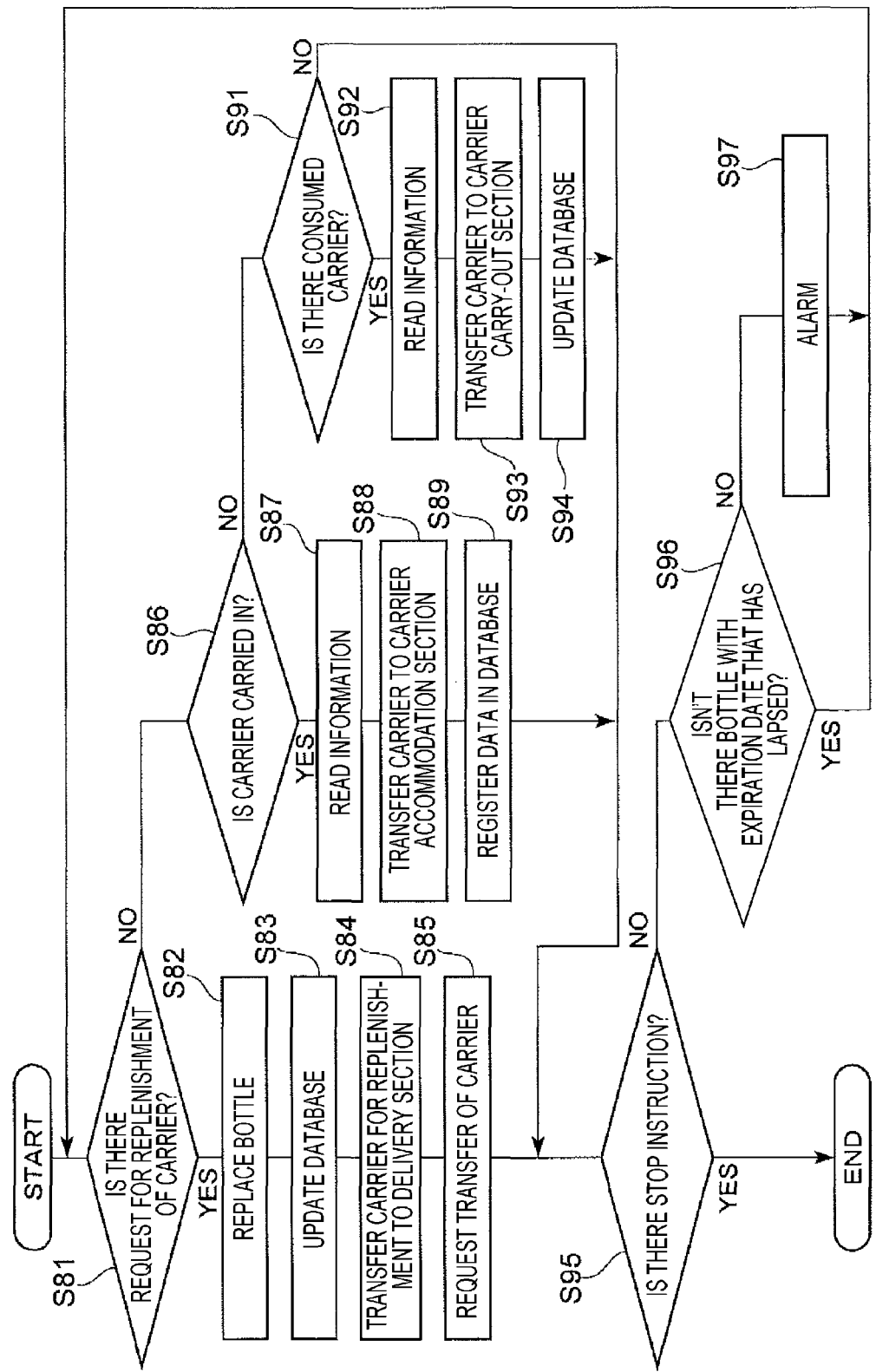

PROCESSING LIQUID SUPPLY SYSTEM, PROCESSING LIQUID SUPPLY APPARATUS, AND CARRIER STORAGE APPARATUS

CROSS REFERENCE TO RELATED APPLICATIONS

This application is a national phase of PCT application No. PCT/JP2018/040567, filed on 31 Oct. 2018, which claims priority from Japanese Patent Application No. 2017-211984, filed on 1 Nov. 2017, all of which are incorporated herein by reference.

TECHNICAL FIELD

The present invention relates to a processing liquid supply system, a processing liquid supply apparatus, and a carrier storage apparatus.

BACKGROUND

Patent Document 1 discloses a processing liquid supply apparatus which supplies a processing liquid to a plurality of substrate processing systems from the outside. The processing liquid supply apparatus includes a carry-in/carry-out unit that performs a carrying-in of a new container storing a processing liquid and a carrying-out of a consumed container, a processing liquid supply that pumps and supplies a processing liquid in a container placed at a processing liquid supply position to the plurality of substrate processing systems, and a container replacement mechanism that replaces the consumed container at the processing liquid supply position with the new container of the carry-in/carry-out unit.

PRIOR ART DOCUMENT

Patent Document

Patent Document 1: Japanese Patent Laid-Open Publication No. 2017-076669

SUMMARY OF THE INVENTION

Problem to be Solved

An object of the present disclosure is to provide a processing liquid supply system, a processing liquid supply apparatus, and a carrier storage apparatus which are effective in reducing the burden of a work for replenishing and retrieving a processing liquid bottle in processing substrates.

Means to Solve the Problem

According to an aspect of the present disclosure, a processing liquid supply system includes: a processing liquid supply apparatus including a first carrier accommodation section that accommodates a carrier accommodating a plurality of processing liquid bottles, a first bottle accommodation section that accommodates a processing liquid bottle taken out from the carrier, a liquid feeding section that feeds a processing liquid to a substrate processing apparatus from the processing liquid bottle taken out from the carrier, and a first transfer unit that transfers the processing liquid bottle among the first carrier accommodation section, the first bottle accommodation section, and the liquid feeding section; and a control device configured to control the first transfer unit to take the processing liquid bottle out from the carrier of the first carrier accommodation section and transfer the processing liquid bottle to the first bottle accommodation section, control the first transfer arm to transfer the processing liquid bottle from the first bottle accommodation section to the liquid feeding section, and control the first transfer unit to transfer the consumed processing liquid bottle from the liquid feeding section and accommodate the consumed processing liquid bottle in the carrier of the first carrier accommodation section.

According to the processing liquid supply system, since the processes of taking the processing liquid bottle out from the carrier, placing the processing liquid bottle in the liquid feeding section, and returning the consumed processing liquid bottle to the carrier are automatically performed, it is possible to replenish and retrieve a processing liquid bottle in units of carriers. As a result, the frequency of performing the work for replenishing and retrieving a processing liquid bottle is reduced. Further, a buffering is performed in units of processing liquid bottles using the bottle accommodation section, so that swiftness may be maintained in replacing a processing liquid bottle in the liquid feeding section. Accordingly, the present disclosure is effective in reducing the burden of the work for replenishing and retrieving a processing liquid bottle in processing substrates.

The processing liquid supply apparatus may further include a first delivery section that delivers the carrier, and the control device may be configured to control the first transfer unit to transfer the carrier placed in the first delivery section to the first carrier accommodation section, and control the first transfer unit to transfer the carrier accommodating the consumed processing liquid bottle from the first carrier accommodation section to the first delivery section. In this case, the work for delivering a carrier in the processing liquid supply apparatus is simplified. The simplification of the work for delivering a carrier may also contribute to the automation of the work. Accordingly, the present disclosure is effective in further reducing the burden of the work for replacing a processing liquid bottle.

The control device may control the first transfer unit to, while the processing liquid bottle is completely consumed after being placed in the liquid feeding section, transfer another processing liquid bottle between the carrier of the first carrier accommodation section and the first bottle accommodation section. In this case, a buffering is performed in units of processing liquid bottles while the processing liquid bottle is completely consumed after being placed in the liquid feeding section, so that swiftness may be further reliably maintained in replacing a processing liquid bottle in the liquid feeding section.

The processing liquid supply apparatus may include a plurality of liquid feeding sections, and the first transfer unit may be configured such that a range capable of transferring the processing liquid bottle includes the plurality of liquid feeding sections. In this case, since the plurality of liquid feeding systems share the first transfer unit, the configuration of the apparatus may be simplified.

The control device may be configured to further control the first transfer unit to open and close a cap of the processing liquid bottle in the liquid feeding section. In this case, since the plurality of liquid feeding systems share at least a portion of the configuration for opening and closing the cap, the configuration of the apparatus may be simplified.

The liquid feeding section may include a liquid feeding head for feeding a processing liquid from the inside of the processing liquid bottle, and the control device may be configured to further control the first transfer unit to mount the liquid feeding head on the processing liquid bottle. In this case, since the plurality of liquid feeding systems share at least a portion of the configuration for mounting the liquid feeding head, the configuration of the apparatus may be further simplified.

The carrier may include an information holding unit that holds information on the processing liquid accommodated in the processing liquid bottle, and the control device may acquire information on a type of the processing liquid accommodated in the processing liquid bottle based on the information held by the information holding unit, and select the processing liquid bottle to be taken out from the carrier based on the type of the processing liquid. In this case, a high efficiency may be implemented in transferring bottles in the processing liquid supply apparatus using the information held in the information holding unit.

The control device may acquire information on an expiration date of the processing liquid accommodated in the processing liquid bottle based on the information held by the information holding unit, and select the processing liquid bottle to be taken out from the carrier in such a way that the processing liquid bottle of which processing liquid has a relatively earlier expiration date is preferentially transferred to the liquid feeding section. In this case, it is possible to prevent the lapse of an expiration date of a processing liquid.

The processing liquid supply system may further include a notification device that performs a switching between a normal state indicating that expiration dates of processing liquids of all of the processing liquid bottles have not lapsed, and an alarm state indicating that an expiration date of a processing liquid of at least one of the processing liquid bottles has lapsed, and the control device may be configured to further control the notification device to switch the normal state to the alarm state when there exists the processing liquid bottle of which processing liquid has an expiration date that has lapsed. In this case, the consumption of the processing liquid having the consume-by date that has lapsed is prevented, so that the reliability may be further improved.

The processing liquid supply apparatus may further include a housing that includes the first carrier accommodation section, the first bottle accommodation section, the liquid feeding section, and the first transfer unit, and a temperature regulator that regulates a temperature inside the housing. In this case, the temperature of processing liquids may be managed using the simple configuration in which processing liquid bottles are intensively disposed in the housing of the processing liquid supply apparatus.

The processing liquid supply system may further include a carrier storage apparatus that stores a plurality of carriers, and an automatic transfer device that transfers each of the plurality of carriers between the carrier storage apparatus and the processing liquid supply apparatus. In this case, the carrier storage apparatus that stores a plurality of carriers is interposed between a carrier supply source and the processing liquid supply apparatus, so that the frequency of the work for replenishing and retrieving a carrier may be further reduced.

The carrier storage apparatus may include a plurality of second carrier accommodation sections that accommodates the plurality of carriers, respectively, a second bottle accommodation section that accommodates the processing liquid bottle taken out from the carrier, and a second transfer unit that transfers the processing liquid bottle between the second carrier accommodation section and the second bottle accommodation section, and the control device may be configured to further control the second transfer unit to replace the processing liquid bottle between the carrier and another carrier such that the plurality of processing liquid bottles in the carrier to be sent to the processing liquid supply apparatus accommodate a processing liquid suitable for the processing liquid supply apparatus. In this case, it is possible to implement both the reduction in frequency of the work for replenishing and retrieving a processing liquid bottle and the less waste in supplying a processing liquid bottle.

According to another aspect of the present disclosure, a processing liquid supply apparatus includes: a first carrier accommodation section configured to accommodate a carrier accommodating a plurality of processing liquid bottles; a first bottle accommodation section configured to accommodate a processing liquid bottle taken out from the carrier; a liquid feeding section configured to feed a processing liquid from the processing liquid bottle taken out from the carrier to a substrate processing apparatus; and a first transfer section configured to transfer the processing liquid bottle among the first carrier accommodation section, the first bottle accommodation section, and the liquid feeding section.

According to yet another aspect of the present disclosure, a carrier storage apparatus includes a second carrier accommodation section configured to accommodate a plurality of carriers each accommodating a plurality of processing liquid bottles; a second bottle accommodation section configured to accommodate a processing liquid bottle taken out from the carrier; a second transfer unit configured to transfer the processing liquid bottle between the second carrier accommodation section and the second bottle accommodation section; and a second delivery section configured to deliver the carrier to and from a processing liquid supply apparatus that supplies a processing liquid to a substrate processing apparatus.

Effect of the Invention

According to the present disclosure, it is possible to provide a processing liquid supply system, a processing liquid supply apparatus, and a carrier storage apparatus which are effective in reducing the burden of a work for replenishing and retrieving a processing liquid bottle in processing substrates.

BRIEF DESCRIPTION OF THE DRAWINGS

FIG. 13 is a flowchart illustrating a procedure of storing a carrier.

DETAILED DESCRIPTION TO EXECUTE THE INVENTION

Figure 1:
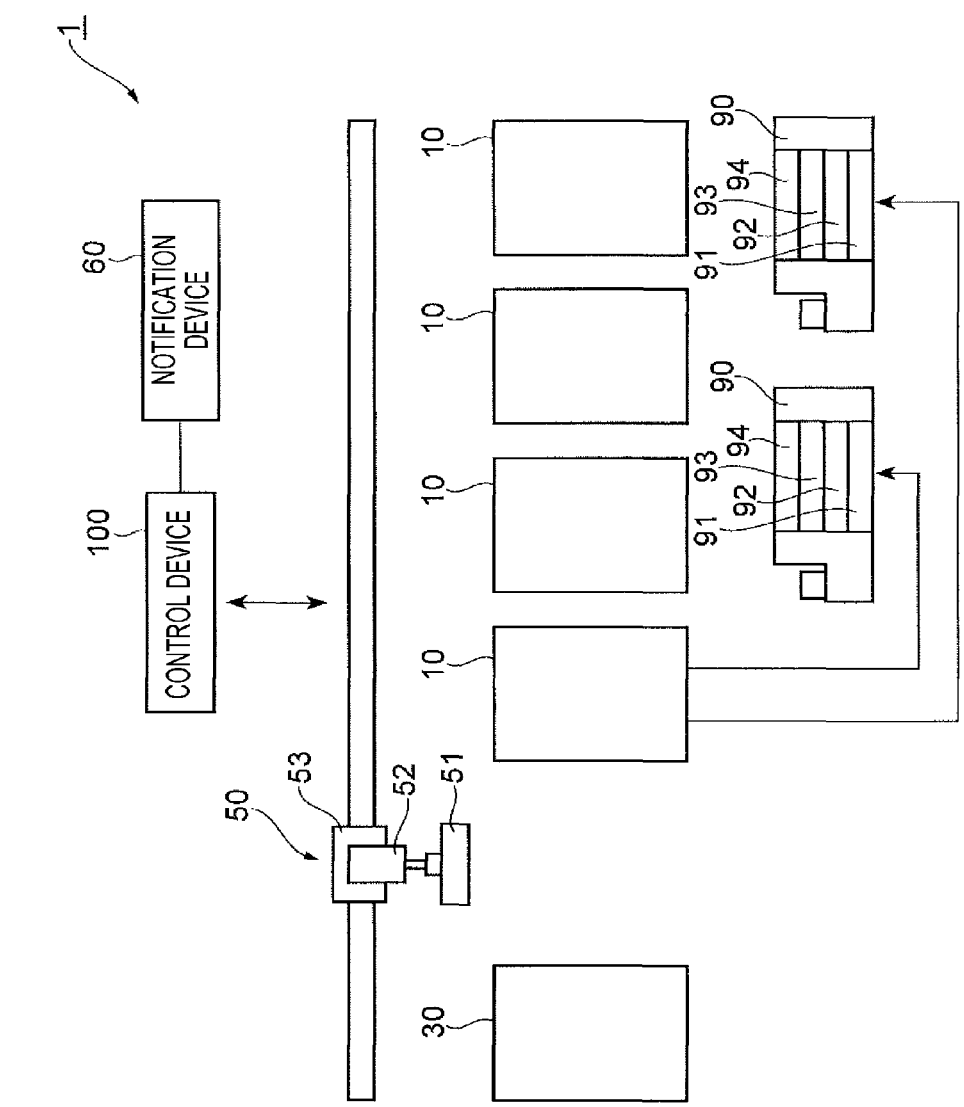
FIG. 1 is a schematic view illustrating a configuration of a processing liquid supply system.

Hereinafter, an embodiment will be described in detail with reference to the drawings. In the descriptions, the same components or components having the same function will be denoted by the same reference numerals, and overlapping descriptions thereof will be described.

[Processing Liquid Supply System]

As illustrated in FIG. 1, a processing liquid supply system 1 according to an embodiment of the present disclosure relates to a system for supplying a processing liquid to at least one substrate processing apparatus 90. The substrate processing apparatus 90 performs a predetermined processing on a semiconductor wafer using the processing liquid supplied from the processing liquid supply system 1. For example, the substrate processing apparatus 90 applies a processing liquid for forming a resist film to form a resist film on the surface of the wafer, and supplies a development processing liquid and a rinsing processing liquid to the exposed resist film to form a resist pattern. For example, the substrate processing apparatus 90 includes processing modules 91, 92, and 93 for forming a film such as a resist film, and a processing module 94 for a developing process.

The processing liquid supply system 1 includes at least one processing liquid supply apparatus 10, a carrier storage apparatus 30, an automatic transfer device 50, a notification device 60, and a control device 100. As illustrated, the processing liquid supply system 1 may include a plurality of processing liquid supply apparatuses 10.

Each processing liquid supply apparatus 10 takes a processing liquid bottle out from a carrier 70 accommodating a plurality of processing liquid bottles, and feeds a processing liquid from the processing liquid bottle to at least one substrate processing apparatus 90. The plurality of processing liquid bottles accommodated in the carrier 70 may accommodate the same type of processing liquids or may accommodate different types of processing liquids. As illustrated, each processing liquid supply apparatus 10 may be configured to supply the processing liquid to a plurality of substrate processing apparatuses 90.

The carrier storage apparatus 30 accommodates a plurality of carriers 70 to be sent to the processing liquid supply apparatus 10. The automatic transfer device 50 transfers a carrier 70 between the carrier storage apparatus 30 and the processing liquid supply apparatus 10. The notification device 60 notifies the lapse of an expiration date of a processing liquid in a processing liquid bottle. The control device 100 controls the processing liquid supply apparatus 10, the carrier storage apparatus 30, the automatic transfer device 50, and the notification device 60. Hereinafter, the configuration of each device will be described.

(Processing Liquid Supply Apparatus)

Figure 2:
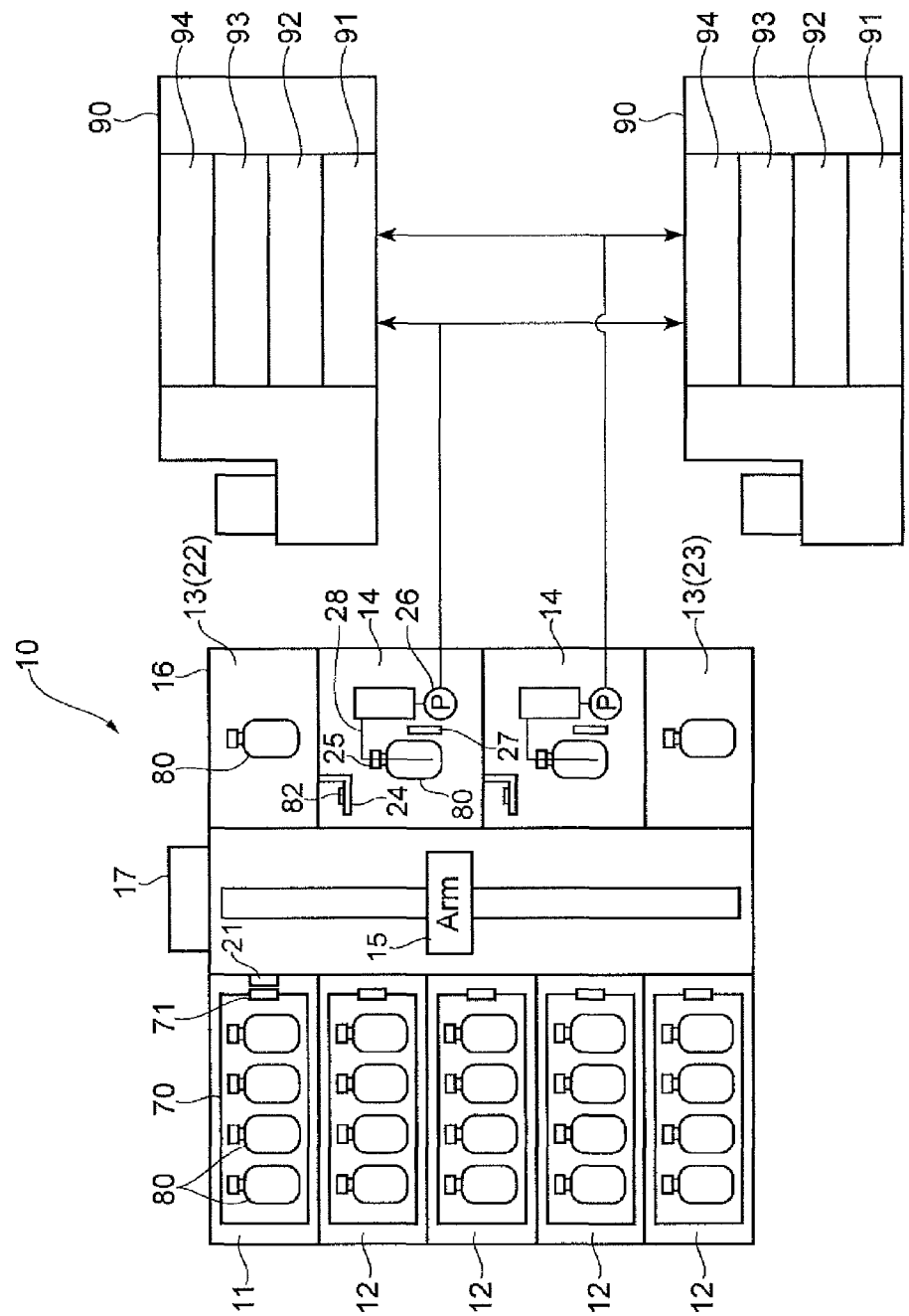
FIG. 2 is a schematic view illustrating a configuration of a processing liquid supply apparatus.

As illustrated in FIG. 2, the processing liquid supply apparatus 10 includes a delivery section 11, a plurality of carrier accommodation sections 12, a plurality of bottle accommodation sections 13, a plurality of liquid feeding sections 14, a transfer unit 15, a housing 16, and a temperature regulator 17.

The delivery section 11 (a first delivery section) is used for delivering the carrier 70 between the processing liquid supply apparatus 10 and the automatic transfer device 50 (i.e., for delivering the carrier 70 between the processing liquid supply apparatus 10 and the carrier storage apparatus 30). The delivery section 11 is provided in a top portion of the processing liquid supply apparatus 10 such that the carrier 70 may be taken in and out from above. The delivery section 11 includes a reading unit 21 that reads information. The carrier 70 includes an information holding unit 71 that holds information to be read by the reading unit 21. The reading unit 21 is disposed at a position where the reading unit 21 is able to read the information holding unit 71, in the delivery section 11.

The information held by the information holding unit 71 includes information on a processing liquid accommodated in a processing liquid bottle 80 inside the carrier 70. For example, the information held by the information holding unit 71 may include information on a type of the processing liquid accommodated in the processing liquid bottle 80 inside the carrier 70. In addition, the information held by the information holding unit 71 may include information on an expiration date of the processing liquid accommodated in the processing liquid bottle 80 inside the carrier 70. In addition, the information held by the information holding unit 71 may include identification information of the carrier 70. When the identification information of the carrier 70 is stored in a database in association with the information on the processing liquid accommodated in the processing liquid bottle 80 inside the carrier 70, the identification information also is regarded as a kind of information on the processing liquid.

The information holding unit 71 may be, for example, an image pattern such as a bar code, and the reading unit 21 may be a camera for acquiring the image pattern. In addition, the information holding unit 71 may be an IC chip that stores information, and the reading unit 21 may be a reader of the IC chip.

Each of the plurality of carrier accommodation sections 12 (first carrier accommodation sections) accommodates the plurality of carriers 70. The plurality of carrier accommodation sections 12 are arranged vertically below the delivery section 11.

Each of the bottle accommodation sections 13 (first bottle accommodation sections) accommodates a processing liquid bottle 80 taken out from the carrier 70. The bottle accommodation section 13 may be configured to accommodate a plurality of processing liquid bottles 80. The plurality of bottle accommodation sections 13 are arranged vertically at positions separated from the carrier accommodation sections 12. The plurality of bottle accommodation sections 13 include a replenished bottle accommodation section 22 that accommodates a processing liquid bottle 80 taken out from the carrier 70, before the processing liquid bottle 80 is used for the feeding of liquid to the substrate processing apparatus 90, and an empty bottle accommodation section 23 that accommodates a processing liquid bottle 80 which has been used for the feeding of liquid to the substrate processing apparatus 90 (hereinafter, referred to as a "consumed processing liquid bottle 80").

Each of the liquid feeding sections 14 feeds a processing liquid from the processing liquid bottle 80 taken out from the carrier 70, to the substrate processing apparatus 90. The liquid feeding sections 14 are arranged vertically together with the plurality of bottle accommodation sections 13. For example, the liquid feeding sections 14 are arranged between the vertically arranged bottle accommodation sections 13. For example, each liquid feeding section 14 includes an opening/closing jig 24, a liquid feeding pipeline 28, a liquid feeding head 25, a pump 26, and a liquid level sensor 27.

The opening/closing jig 24 holds a cap 82 of the processing liquid bottle 80 when the cap 82 is opened/closed. The liquid feeding pipeline 28 is a pipeline connected to the substrate processing apparatus 90. For example, the liquid feeding pipeline 28 branches in the middle thereof to be connected to the plurality of substrate processing apparatuses 90. The liquid feeding head 25 is mounted on the opened processing liquid bottle 80 (the processing liquid bottle 80 with the cap 82 taken off), and feeds the processing liquid from the inside of the processing liquid bottle 80 to the liquid feeding pipeline 28. The pump 26 is provided in the liquid feeding pipeline 28, and pumps and feeds the processing liquid from the side of the processing liquid bottle 80 to the side of the substrate processing apparatus 90. The liquid level sensor 27 detects the liquid level of the processing liquid in the processing liquid bottle 80. The liquid level sensor 27 is, for example, a non-contact sensor such as an ultrasonic or electrostatic capacitance type of a sensor.

The transfer unit 15 (a first transfer unit) transfers the processing liquid bottle 80 among the carrier accommodation sections 12, the bottle accommodation sections 13, and the liquid feeding sections 14, and transfers the carrier 70 between the delivery section 11 and the carrier accommodation sections 12. The transfer unit 15 is disposed between the delivery section 11/the plurality of carrier accommodation sections 12 and the plurality of bottle accommodation sections 13/the liquid feeding sections 14. For example, the transfer unit 15 is a robot arm with multiple degrees of freedom such as upward/downward movements, a horizontal movement, pivoting, and gripping. The transfer unit 15 is configured such that a range in which the processing liquid bottle 80 can be transferred includes the plurality of liquid feeding sections 14. For example, the range in which the transfer unit 15 is able to transfer the processing liquid bottle 80 includes the delivery section 11, all of the carrier accommodation sections 12, all of the bottle accommodation sections 13, and all of the liquid feeding sections 14.

The housing 16 accommodates the delivery section 11, all of the carrier accommodation sections 12, all of the bottle accommodation sections 13, and all of the liquid feeding sections 14. The temperature regulator 17 regulates the temperature inside the housing 16. For example, the temperature regulator 17 includes a heater, a cooler, and a fan (all not illustrated).

(Carrier Storage Apparatus)

Figure 3:
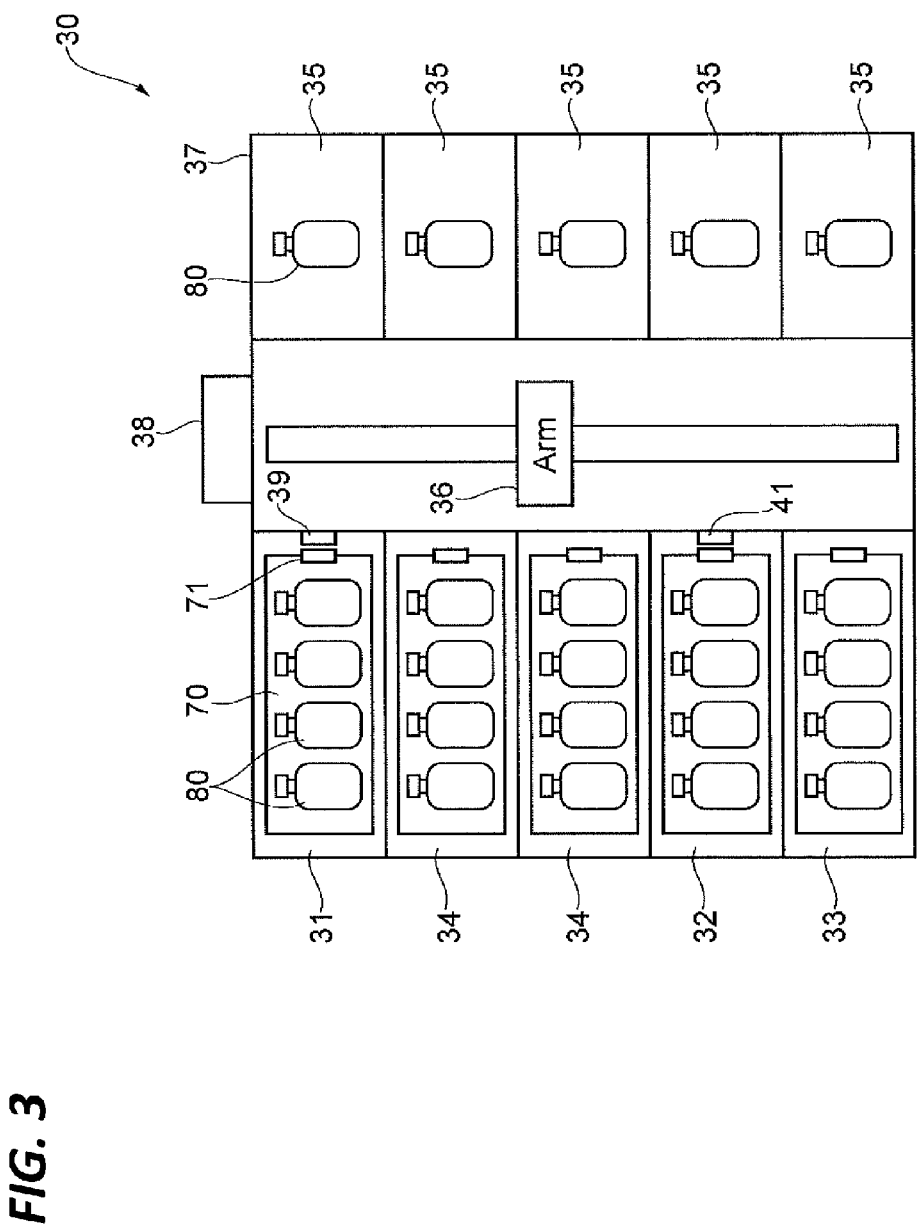
FIG. 3 is a schematic view illustrating a configuration of a bottle storage apparatus.

As illustrated in FIG. 3, the carrier storage apparatus 30 includes a delivery section 31, a carry-in section 32, a carry-out section 33, a plurality of carrier accommodation sections 34, a plurality of bottle accommodation sections 35, and a transfer unit 36.

The delivery section 31 (a second delivery section) is used for delivering the carrier 70 between the carrier storage apparatus 30 and the automatic transfer device 50 (i.e., for delivering the carrier 70 between the carrier storage apparatus 30 and the processing liquid supply apparatus 10). The delivery section 31 is provided in a top portion of the carrier storage apparatus 30 such that the carrier 70 may be taken in and out from above. The delivery section 31 includes a reading unit 39 which is the same as the reading unit 21 described above. The reading unit 39 is disposed at a position where the reading unit 39 is able to read the information holding unit 71, in the delivery section 31.

The carry-in section 32 is used for replenishing the carrier 70. The carry-in section 32 is provided below the delivery section 31 such that the carrier 70 may be carried in from the lateral side. The carry-in section 32 includes a reading unit 41 which is the same as the reading unit 21 described above. The reading unit 41 is disposed at a position where the reading unit 41 is able to read the information holding unit 71, in the carry-in section 32.

The carry-out section 33 is used for carrying out a carrier 70 accommodating a consumed processing liquid bottle 80. The carry-out section 33 is provided below the delivery section 31 such that the carrier 70 may be carried out from the lateral side.

Each of the plurality of carrier accommodation sections 34 (second carrier accommodation sections) accommodates a plurality of carriers 70. The plurality of carrier accommodation sections 34 are arranged vertically between the delivery section 31 and the carry-in section 32/the carry-out section 33.

Each of the bottle accommodation sections 35 (second bottle accommodation sections) accommodates a processing liquid bottle 80 taken out from the carrier 70. Each bottle accommodation section 35 may be configured to accommodate a plurality of processing liquid bottles 80. The plurality of bottle accommodation sections 35 are arranged vertically at positions separated from the carrier accommodation sections 34.

The transfer unit 36 (a second transfer unit) transfers the processing liquid bottle 80 between the carrier accommodation sections 34 and the bottle accommodation sections 35, and transfers the carrier 70 among the delivery section 31, the carry-in section 32, the carry-out section 33, and the carrier accommodation sections 34. The transfer unit 36 is disposed between the delivery section 31/the carry-in section 32/the carry-out section 33/the plurality of carrier accommodation sections 34 and the plurality of bottle accommodation sections 35. For example, the transfer unit 36 is a robot arm with multiple degrees of freedom such as upward/downward movements, a horizontal movement, pivoting, and gripping. The transfer unit 36 is configured such that a range in which the processing liquid bottle 80 can be transferred includes the delivery section 31, the carry-in section 32, the carry-out section 33, all of the carrier accommodation sections 34, and all of the bottle accommodation sections 35.

The housing 37 accommodates the delivery section 31, the carry-in section 32, the carry-out section 33, all of the carrier accommodation sections 34, and all of the bottle accommodation sections 35. The temperature regulator 38 regulates the temperature inside the housing 37. For example, the temperature regulator 38 includes a heater, a cooler, and a fan (all not illustrated).

Meanwhile, the carrier storage apparatus 30 may further include a liquid feeding section that feeds a processing liquid from the processing liquid bottle 80 taken out from the carrier 70 to the substrate processing apparatus 90, similarly to the processing liquid supply apparatus 10. In other words, the processing liquid supply system 1 may be configured such that any one of the plurality of processing liquid supply apparatuses 10 functions as the carrier storage apparatus 30.

(Automatic Transfer Device)

The automatic transfer device 50 is, for example, an OHT (overhead hoist transfer), and includes a holding unit 51 that holds the carrier 70 by, for example, adsorption or gripping, a lifting unit 52 that moves the holding unit 51 up and down, and a transfer unit 53 that transfers the holding unit 51 between the carrier storage apparatus 30 and the processing liquid supply apparatus 10.

(Notification Device)

The notification device 60 is a display device such as an image display monitor or a warning light, and performs a switching between a normal state indicating that expiration dates of processing liquids in the processing liquid bottles 80 has not lapsed, and an alarm state indicating that an expiration date of a processing liquid in at least one of the processing liquid bottles 80 has lapsed. The notification device 60 may be configured to indicate an apparatus that includes the processing liquid bottle 80 of which processing liquid has an expiration date that has lapsed, in the alarm state.

(Control Device)

The control device 100 is configured to control the transfer unit 15 to take the processing liquid bottle 80 out from the carrier 70 of the carrier accommodation section 12 and transfer the processing liquid bottle 80 to the bottle accommodation section 13, control the transfer unit 15 to transfer the processing liquid bottle 80 from the bottle accommodation section 13 to the liquid feeding section 14, and control the transfer unit 15 to transfer the consumed processing liquid bottle 80 from the liquid feeding section 14 and accommodate the consumed processing liquid bottle 80 in the carrier 70 of the carrier accommodation section 12.

The control device 100 may be configured to further control the transfer unit 15 to transfer the carrier 70 placed in the delivery section 11 to the carrier accommodation section 12, and control the transfer unit 15 to transfer the carrier 70 accommodating the consumed processing liquid bottle 80 from the carrier accommodation section 12 to the delivery section 11. The control device 100 may control the transfer unit 15 such that while the processing liquid bottle 80 is completely consumed after being placed in the liquid feeding section 14, another processing liquid bottle 80 is transferred between the carrier 70 of the carrier accommodation section 12 and the carrier storage apparatus 30. The control device 100 may be configured to further control the transfer unit 15 to open/close the cap 82 of the processing liquid bottle 80 in the liquid feeding section 14, and may be configured to further control the transfer unit 15 to mount the liquid feeding head 25 on the processing liquid bottle 80.

The control device 100 may acquire information on a type of a processing liquid accommodated in a processing liquid bottle 80 based on the information held by the information holding unit 71, and may select a processing liquid bottle 80 to be taken out from the carrier 70 based on the type of the processing liquid. The control device 100 may acquire information on an expiration date of a processing liquid accommodated in a processing liquid bottle 80 based on the information held by the information holding unit 71, and may select a processing liquid bottle 80 to be taken out from the carrier 70 in a way that a processing liquid bottle 80 of which processing liquid has a relatively earlier expiration date is preferentially transferred to the liquid feeding section 14. The control device 100 may be configured to further control the notification device 60 to switch the normal state to the alarm state when there exists a processing liquid bottle 80 of which processing liquid has an expiration date that has lapsed.

The control device 100 may be configured to further control the transfer unit 36 to replace a processing liquid bottle 80 between the carrier 70 and another carrier 70, in order to bring a plurality of processing liquid bottles 80 in the carrier 70 to be sent to the processing liquid supply apparatus 10 into a state of accommodating a processing liquid suitable for the processing liquid supply apparatus 10.

Figure 4:
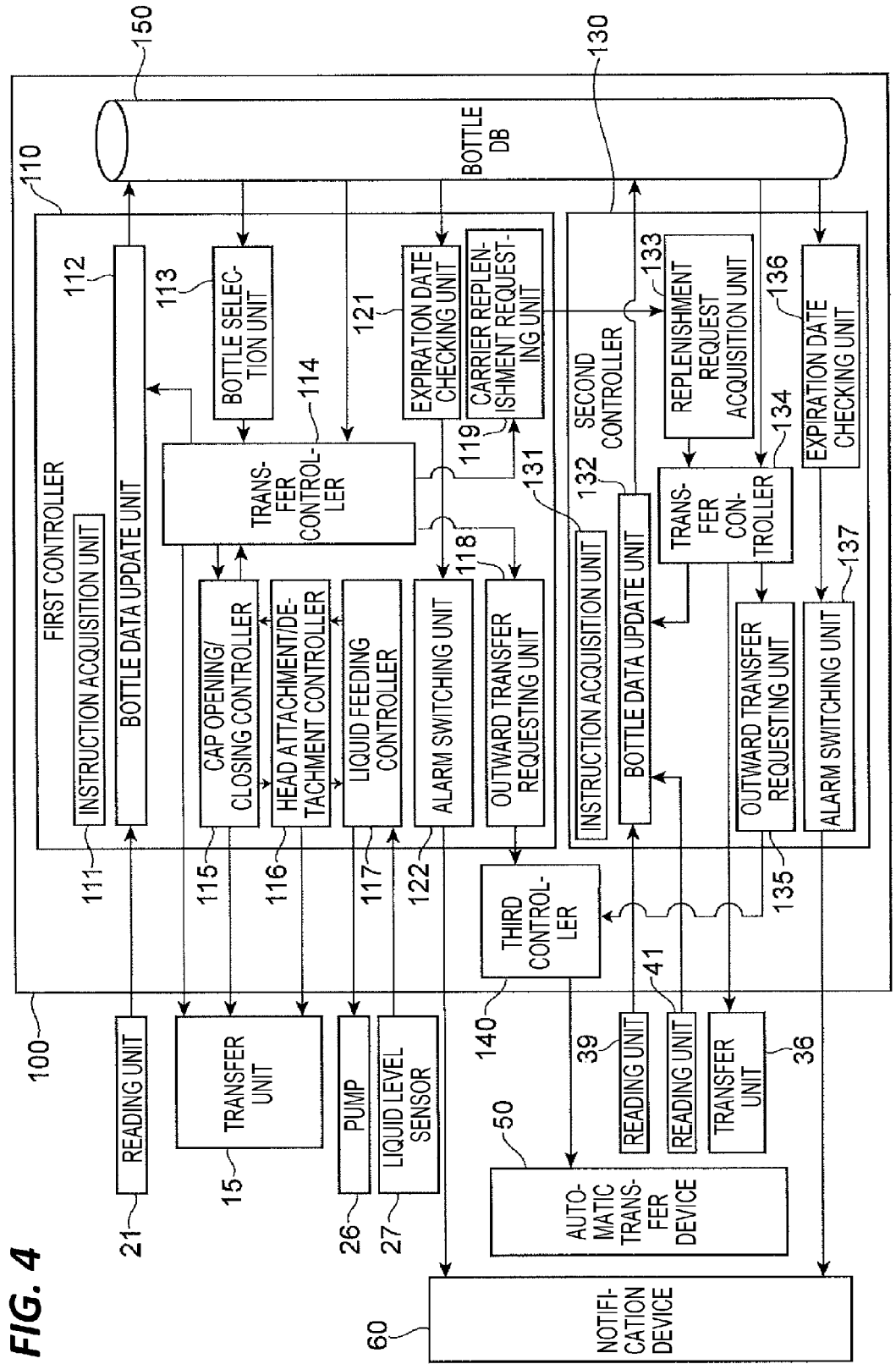
FIG. 4 is a block diagram illustrating a functional configuration of a control device.

As illustrated in FIG. 4, the control device 100 includes functional components such as a first controller 110 that controls the processing liquid supply apparatus 10, a second controller 130 that controls the carrier storage apparatus 30, a third controller 140 that controls the automatic transfer device 50, and a bottle database 150 that stores information on a processing liquid bottle 80 (hereinafter, referred to as "functional modules").

For example, the bottle database 150 includes table data in which identification information of a processing liquid bottle 80, location information of the processing liquid bottle 80, a type of a processing liquid accommodated in the processing liquid bottle 80, and an expiration date of the processing liquid accommodated in the processing liquid bottle 80 are associated with each other. When a processing liquid bottle 80 is accommodated in a carrier 70, the location information of the processing liquid bottle 80 includes identification information of the carrier 70 and location information of the carrier 70. The location information of the carrier 70 includes identification information of a place where the carrier 70 is disposed (the delivery sections 11 and 31, the carrier accommodation sections 12 and 34, the carry-in section 32 or the carry-out section 33). When a processing liquid bottle 80 is present outside a carrier 70, the location information of the processing liquid bottle 80 includes identification information of a place where the processing liquid bottle 80 is disposed (the bottle accommodation sections 13 and 35).

The first controller 110 includes an instruction acquisition unit 111, a bottle data update unit 112, a bottle selection unit 113, a transfer controller 114, a cap opening/closing controller 115, a head attachment/detachment controller 116, a liquid feeding controller 117, an outward transfer requesting unit 118, a carrier replenishment requesting unit 119, an expiration date checking unit 121, and an alarm switching unit 122, as further detailed functional modules.

The instruction acquisition unit 111 acquires an input of an instruction by an operator or an input of an instruction from an upper level control device. The bottle data update unit 112 updates the contents of the bottle database 150 according to the information of the information holding unit 71 that is read by the reading unit 21 and information of a transfer of a processing liquid bottle 80 by the transfer unit 15. For example, the bottle data update unit 112 updates the location information of a carrier 70 according to the identification information of the carrier 70 that is read by the reading unit 21 and the information of the transfer of the carrier 70 by the transfer unit 15, and updates the location information of a processing liquid bottle 80 according to the information of the transfer of the processing liquid by the transfer unit 15.

The bottle selection unit 113 acquires information on a type of a processing liquid accommodated in a processing liquid bottle 80 based on the information held by the information holding unit 71, and selects a processing liquid bottle 80 to be taken out from the carrier 70 based on the type of the processing liquid. Further the bottle selection unit 113 acquires information on an expiration date of a processing liquid accommodated in a processing liquid bottle 80 based on the information held by the information holding unit 71, and selects a processing liquid bottle 80 to be taken out from the carrier 70 in a way that a processing liquid bottle 80 of which processing liquid has a relatively early expiration date is preferentially transferred to the liquid feeding section 14. For example, the bottle selection unit 113 refers to the information stored in the bottle database 150, and acquires information on a type and an expiration date of a processing liquid accommodated in a processing liquid bottle 80 inside the carrier 70. As described above, the location information of the carrier 70 stored in the bottle database 150 is updated based on the information held by the information holding unit 71. Thus, referring to the information stored in the bottle database 150 corresponds to referring to the information held in the information holding unit 71.

The transfer controller 114 controls the transfer unit 15 to take a processing liquid bottle 80 out from the carrier 70 of the carrier accommodation section 12 and transfer the processing liquid bottle 80 to the replenished bottle accommodation section 22, controls the transfer unit 15 to transfer the processing liquid bottle 80 from the replenished bottle accommodation section 22 to the liquid feeding section 14, controls the transfer unit 15 to transfer the consumed processing liquid bottle 80 from the liquid feeding section 14 and accommodate the consumed processing liquid bottle 80 in the carrier 70 of the carrier accommodation section 12, controls the transfer unit 15 to transfer the carrier 70 placed in the delivery section 11 to the carrier accommodation section 12, and controls the transfer unit 15 to transfer the carrier 70 accommodating the consumed processing liquid bottle 80 from the carrier accommodation section 12 to the delivery section 11.

The transfer controller 114 may be configured to perform either transferring another processing liquid bottle 80 between the carrier 70 of the carrier accommodation section 12 and the carrier storage apparatus 30 or transferring a carrier 70 between the delivery section 11 and the carrier accommodation section 12, while the previous processing liquid bottle 80 is completely consumed after being placed in the liquid feeding section 14.

The cap opening/closing controller 115 controls the transfer unit 15 to open/close the cap 82 of the processing liquid bottle 80 in the liquid feeding section 14. The head attachment/detachment controller 116 controls the transfer unit 15 to attach/detach the liquid feeding head 25 to/from the processing liquid bottle 80.

The liquid feeding controller 117 controls the liquid feeding section 14 to start or stop the feeding of liquid to the substrate processing apparatus 90. For example, the liquid feeding controller 117 controls the liquid feeding section 14 to make the pump 26 enter into an ON state from an OFF state after the liquid feeding head 25 is mounted on the processing liquid bottle 80, and controls the liquid feeding section 14 to make the pump 26 enter into the OFF state from the ON state when the liquid level detected by the liquid level sensor 27 reaches the level at which the feeding of liquid is completed.

The outward transfer requesting unit 118 transmits a signal for requesting a transfer of a consumed carrier 70 (a carrier 70 in which all of the processing liquid bottles 80 have been completely consumed) to the carrier storage apparatus 30, to the third controller 140. The carrier replenishment requesting unit 119 transmits a signal for requesting a replenishment of a carrier 70 to the second controller 130. The signal for requesting the replenishment of a carrier 70 may include information that specifies a type of a processing liquid accommodated in a processing liquid bottle 80 of the carrier 70 for the replenishment.

The expiration date checking unit 121 refers to the information stored in the bottle database 150, and checks whether there exists a processing liquid bottle 80 of which processing liquid has an expiration date that has lapsed in the processing liquid supply apparatus 10. The alarm switching unit 122 controls the notification device 60 to switch the normal state to the alarm state, when there exists the processing liquid bottle 80 of which processing liquid has an expiration date that has lapsed in the processing liquid supply apparatus 10. At this time, the alarm switching unit 122 may control the notification device 60 to indicate the processing liquid supply apparatus 10 that includes the processing liquid bottle 80 of which processing liquid has the expiration date that has lapsed.

The second controller 130 includes an instruction acquisition unit 131, a bottle data update unit 132, a replenishment request acquisition unit 133, a transfer controller 134, an outward transfer requesting unit 135, an expiration date checking unit 136, and an alarm switching unit 137, as further detailed functional modules.

The command acquisition unit 131 acquires an input of an instruction by an operator or an input of an instruction from an upper level control device. The bottle data update unit 132 updates the contents of the bottle database 150 according to the information of the information holding unit 71 that is read by the reading units 39 and 41 and information of a transfer of a processing liquid bottle 80 by the transfer unit 36. For example, the bottle data update unit 132 updates the location information of a carrier 70 according to the identification information of the carrier 70 that is read by the reading units 39 and 41 and the information of the transfer of the carrier 70 by the transfer unit 36, and updates location information of a processing liquid bottle 80 according to the information on the transfer of the processing liquid bottle 80 by the transfer unit 36.

The replenishment request acquisition unit 133 acquires a signal transmitted from the carrier replenishment requesting unit 119 of the first controller 110 (the signal for requesting a replenishment of a carrier 70). The transfer controller 134 controls the transfer unit 36 to replace a processing liquid bottle 80 between a carrier 70 and another carrier 70, in order to bring a plurality of processing liquid bottles 80 in a carrier 70 to be sent to the processing liquid supply apparatus 10 into a state of accommodating a processing liquid suitable for the processing liquid supply apparatus 10. For example, the transfer controller 134 controls the transfer unit 36 to replace a processing liquid bottle 80 between a carrier 70 and another carrier 70, in order to bring a plurality of processing liquid bottles 80 in a carrier 70 to be sent to the processing liquid supply apparatus 10 into a state of accommodating a processing liquid that matches the signal acquired from the carrier replenishment requesting unit 119.

The outward transfer requesting unit 135 transmits a signal for requesting a transfer of a carrier 70 to the processing liquid supply apparatus 10 according to the signal acquired from the carrier replenishment requesting unit 119, to the third controller 140. The expiration date checking unit 136 refers to the information stored in the bottle database 150, and checks whether there exists a processing liquid bottle 80 of which processing liquid has an expiration date that has lapsed in the carrier storage apparatus 30.

The alarm switching unit 137 controls the notification device to switch the normal state to the alarm state when there exists a processing liquid bottle 80 of which processing liquid has an expiration date that has lapsed in the carrier storage apparatus 30. At this time, the alarm switching unit 137 may control the notification device 60 to indicate that there exists a processing liquid bottle 80 of which processing liquid has an expiration date that has lapsed in the carrier storage apparatus 30.

The third controller 140 controls the automatic transfer device 50 to transfer the carrier 70 between the delivery section 31 of the carrier storage apparatus 30 and the delivery section 11 of the processing liquid supply apparatus 10, according to signals from the outward transfer requesting unit 118 and the outward transfer requesting unit 135.

Figure 5:
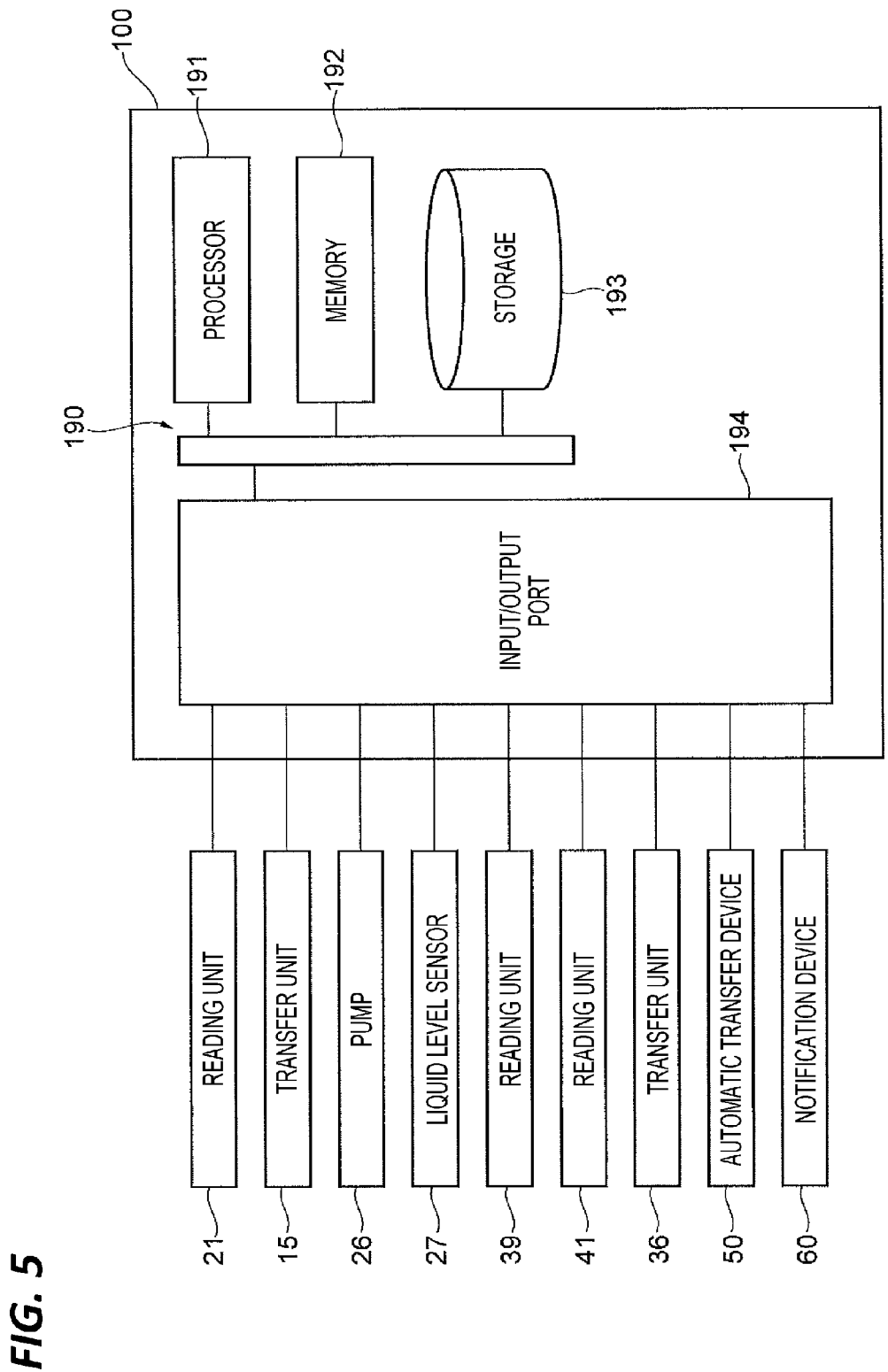
FIG. 5 is a block diagram illustrating a hardware configuration of the control device.

The control device 100 is configured by a control computer. For example, the control device 100 includes a circuit 190 illustrated in FIG. 5. The circuit 190 includes one or more processors 191, a memory 192, a storage 193, and an input/output port 194. The storage 193 includes, for example, a computer-readable storage medium such as a hard disk. The storage medium stores programs for causing the processing liquid supply apparatus 10, the carrier storage apparatus 30, and the automatic transfer device 50 to perform a processing liquid supplying procedure to be described later. The storage medium may be a removable medium such as a nonvolatile semiconductor memory, a magnetic disk or an optical disk. The memory 192 temporarily stores the programs loaded from the storage medium of the storage 193 and calculation results obtained by the processors 191. The processors 191 execute the programs in cooperation with the memory 192, so as to make up the respective functional modules described above. The input/output port 194 performs input/output of signals among the reading units 21, 39, and 41, the transfer units 15 and 36, the pump 26, the liquid level sensor 27, the automatic transfer device 50, and the notification device 60, according to instructions from the processors 191.

Meanwhile, the hardware configuration of the control device 100 may not be necessarily limited to the programs that make up the respective functional modules. For example, the respective functional modules of the control device 100 may be configured by dedicated logic circuits or an ASIC (application specific integrated circuit) in which the circuits are integrated. In addition, the control device 100 may be divided into a plurality of control computers connected to each other by a communication line. For example, the control device 100 may be divided into a control computer for the processing liquid supply apparatus 10, a control computer for the carrier storage apparatus 30, and a control computer for the automatic transfer device 50.

(Processing Liquid Supplying Procedure)

Subsequently, the processing liquid supplying procedure that is performed by the processing liquid supply system 1 will be described as an example of a processing liquid supplying method.

(Procedure for Starting Supply of Processing Liquid)

Figure 6:
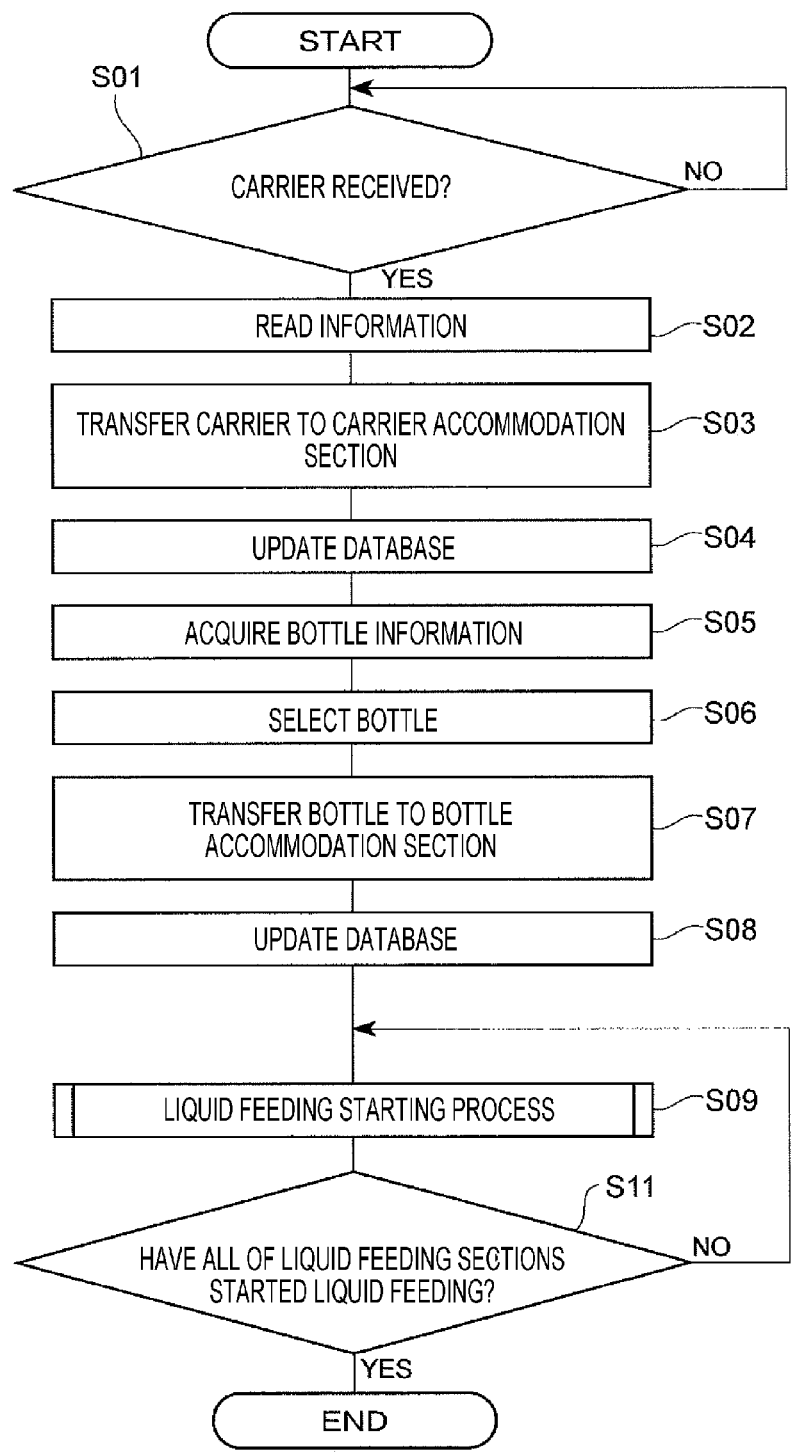
FIG. 6 is a flowchart illustrating a processing liquid supply starting procedure.
Figure 7B:
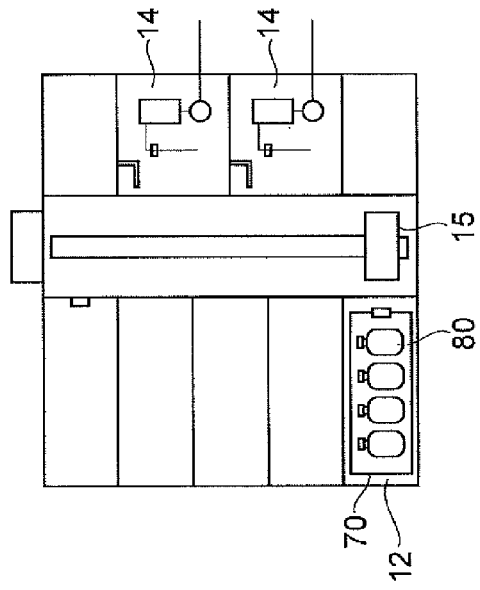
FIGS. 7A to 7C are schematic views illustrating states of the processing liquid supply apparatus during a process from a reception of a carrier until a processing liquid bottle is transferred.
Figure 7A:
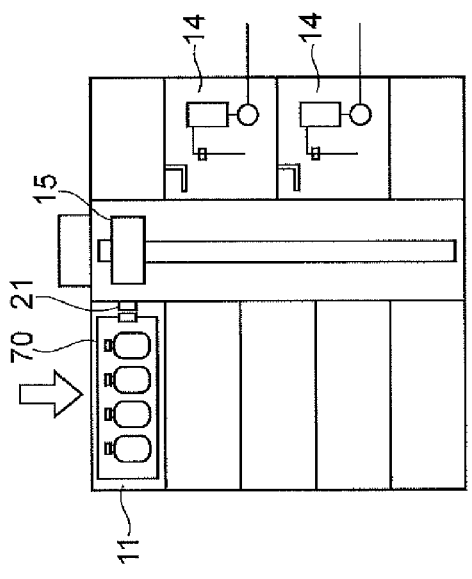

First, descriptions will be made on a procedure until the processing liquid supply apparatus 10 starts to supply a processing liquid to the substrate processing apparatus 90 (hereinafter, referred to as a "processing liquid supply starting procedure"). As illustrated in FIG. 6, first, the control device 100 sequentially performs steps S01, S02, S03, and S04. In step S01, the bottle data update unit 112 waits until the automatic transfer device 50 places a carrier 70 in the delivery section 11 (see FIG. 7A). In step S02, the bottle data update unit 112 acquires information held by the information holding unit 71 of the carrier 70 from the reading unit 21. In step S03, the transfer controller 114 controls the transfer unit 15 to transfer the carrier 70 from the delivery section 11 to any one of the carrier accommodation sections 12 (see FIG. 7B). In step S04, the bottle data update unit 112 updates the contents of the bottle database 150 according to the transfer of the carrier 70 in step S03. For example, the bottle data update unit 112 updates the location information of the carrier 70 according to the transfer of the carrier 70 in step S03.

Next, the control device 100 sequentially performs steps S05, S06, S07, and S08. In step S05, the bottle selection unit 113 refers to the information stored in the bottle database 150, and acquires information on a type and an expiration date of a processing liquid accommodated in a processing liquid bottle 80 of the carrier 70. In step S06, the bottle selection unit 113 selects a processing liquid bottle 80 to be taken out from the carrier 70, based on the information acquired in step S05.

The bottle selection unit 113 selects a processing liquid bottle 80 to be taken out from the carrier 70 based on the type of the processing liquid. Further, the bottle selection unit 113 selects a processing liquid bottle 80 to be taken out from the carrier 70, in a way that a processing liquid bottle 80 of which processing liquid has a relatively early expiration date is preferentially transferred to the liquid feeding section 14. For example, the bottle selection unit 113 selects a plurality of processing liquid bottles 80 as candidates to be taken out from the carrier 70 based on the type of the processing liquid, and selects a processing liquid bottle 80 of which processing liquid has the earliest expiration date among the plurality of processing liquid bottles 80.

Figure 7C:
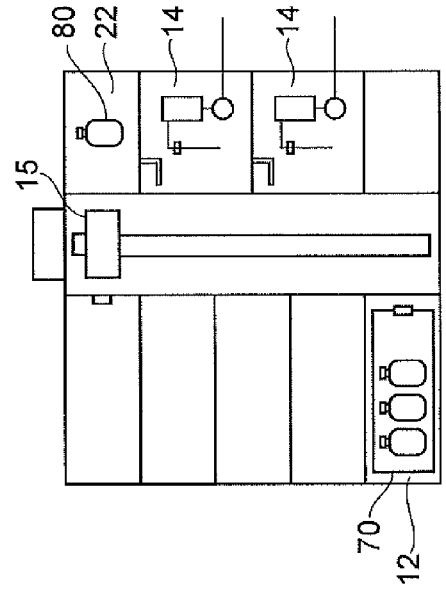

In step S07, the transfer controller 114 controls the transfer unit 15 to take the processing liquid bottle 80 selected in step S06 out from the carrier 70 and transfer the processing liquid bottle 80 to the replenished bottle accommodation section 22 (see FIG. 7C). In step S08, the bottle data update unit 112 updates the contents of the bottle database 150 according to the transfer of the processing liquid bottle 80 in step S07. For example, the bottle data update unit 112 updates the location information of the processing liquid bottle 80 according to the transfer of the processing liquid bottle 80 in step S07. Meanwhile, in steps S06 and S07, a plurality of processing liquid bottles 80 may be selected and transferred.

Next, the control device 100 performs steps S09 and S11. Step S09 includes a process of transferring the processing liquid bottle 80 from the replenished bottle accommodation section 22 to the liquid feeding section 14 to start the feeding of liquid (hereinafter, referred to as a "liquid feeding starting process"). Specific contents of the liquid feeding starting process will be described later. In step S11, the liquid feeding controller 117 checks whether all of the liquid feeding sections 14 have started the feeding of liquid. When it is determined in step S11 that there exists a liquid feeding section 14 that has not started the feeding of liquid, the control device 100 returns the process to step S09. Then, the liquid feeding starting process is repeated until all of the liquid feeding sections 14 start the feeding of liquid. When it is determined in step S11 that all of the liquid feeding sections 14 have started the feeding of liquid, the control device 100 completes the processing liquid supply starting procedure.

Figure 8:
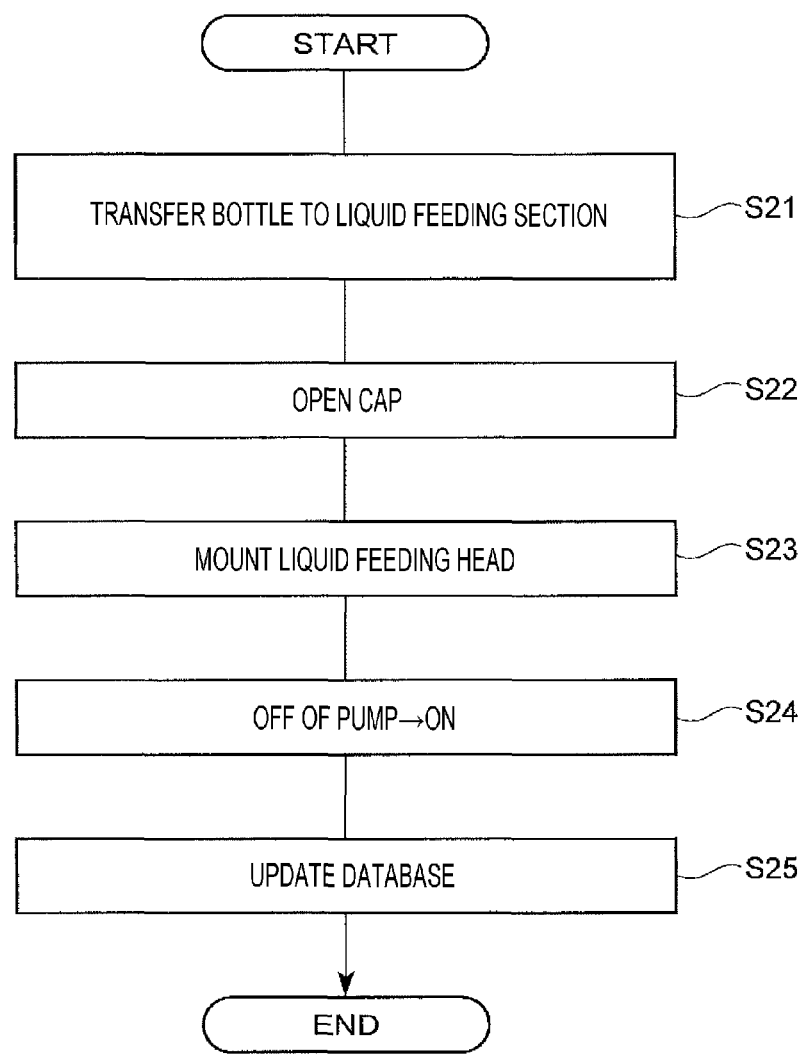
FIG. 8 is a flowchart illustrating a procedure of a liquid feeding starting process.

FIG. 8 is a flowchart illustrating the liquid feeding starting process in step S09. As illustrated in FIG. 8, the control device 100 sequentially performs steps S21, S22, S23, S24, and S25.

Figure 9B:
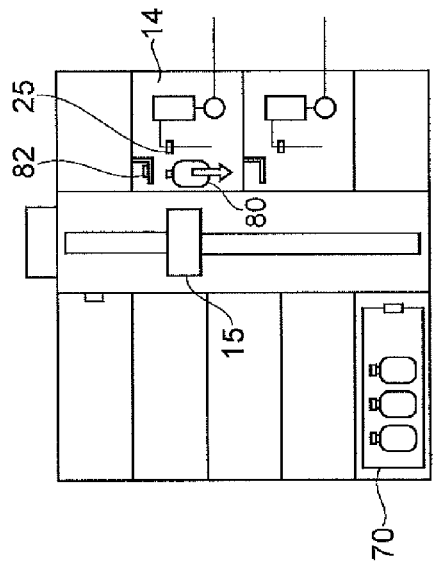
FIGS. 9A to 9C are schematic views illustrating states of the processing liquid supply apparatus during a process from a transfer of a processing liquid bottle to a liquid feeding section until a liquid feeding is started.
Figure 9A:
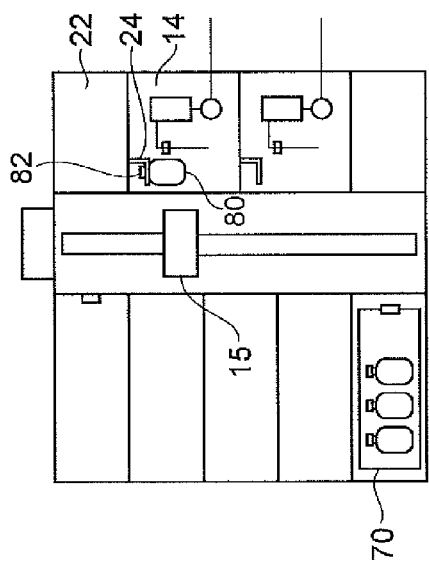

In step S21, the transfer controller 114 controls the transfer unit 15 to transfer the processing liquid bottle 80 from the replenished bottle accommodation section 22 to the liquid feeding section 14. In step S22, the cap opening/closing controller 115 controls the transfer unit 15 to open the cap 82 of the processing liquid bottle 80 transferred to the liquid feeding section 14. For example, the cap opening/closing controller 115 controls the transfer unit 15 to move the processing liquid bottle 80 down in a state where the cap 82 of the processing liquid bottle 80 is held by the opening/closing jig 24 of the liquid feeding section 14 (see FIGS. 9A and 9B). In step S23, the head attachment/detachment controller 116 controls the transfer unit 15 to mount the liquid feeding head 25 on the processing liquid bottle 80 from which the cap 82 has been detached in step S22.

Figure 9C:
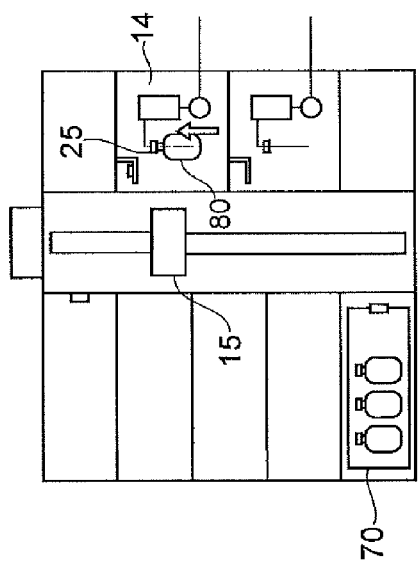

For example, the head attachment/detachment controller 116 controls the transfer unit 15 to place the processing liquid bottle 80 below the liquid feeding head 25, and then, move the processing liquid bottle 80 up toward the liquid feeding head 25 (see FIG. 9C). In step S24, the liquid feeding controller 117 controls the liquid feeding section 14 to switch the OFF state of the pump 26 to the ON state. In step S25, the bottle data update unit 112 updates the contents of the bottle database 150 according to the transfer of the processing liquid bottle 80 in step S21.

(Procedure for Continuing Supply of Processing Liquid)

Subsequently, descriptions will be made on a procedure for continuing the supply of the processing liquid from the processing liquid supply apparatus 10 to the substrate processing apparatus 90 while replacing the processing liquid bottle 80 in the liquid feeding section 14 (hereinafter, referred to as a "procedure for continuing the supply of processing liquid").

Figure 10:
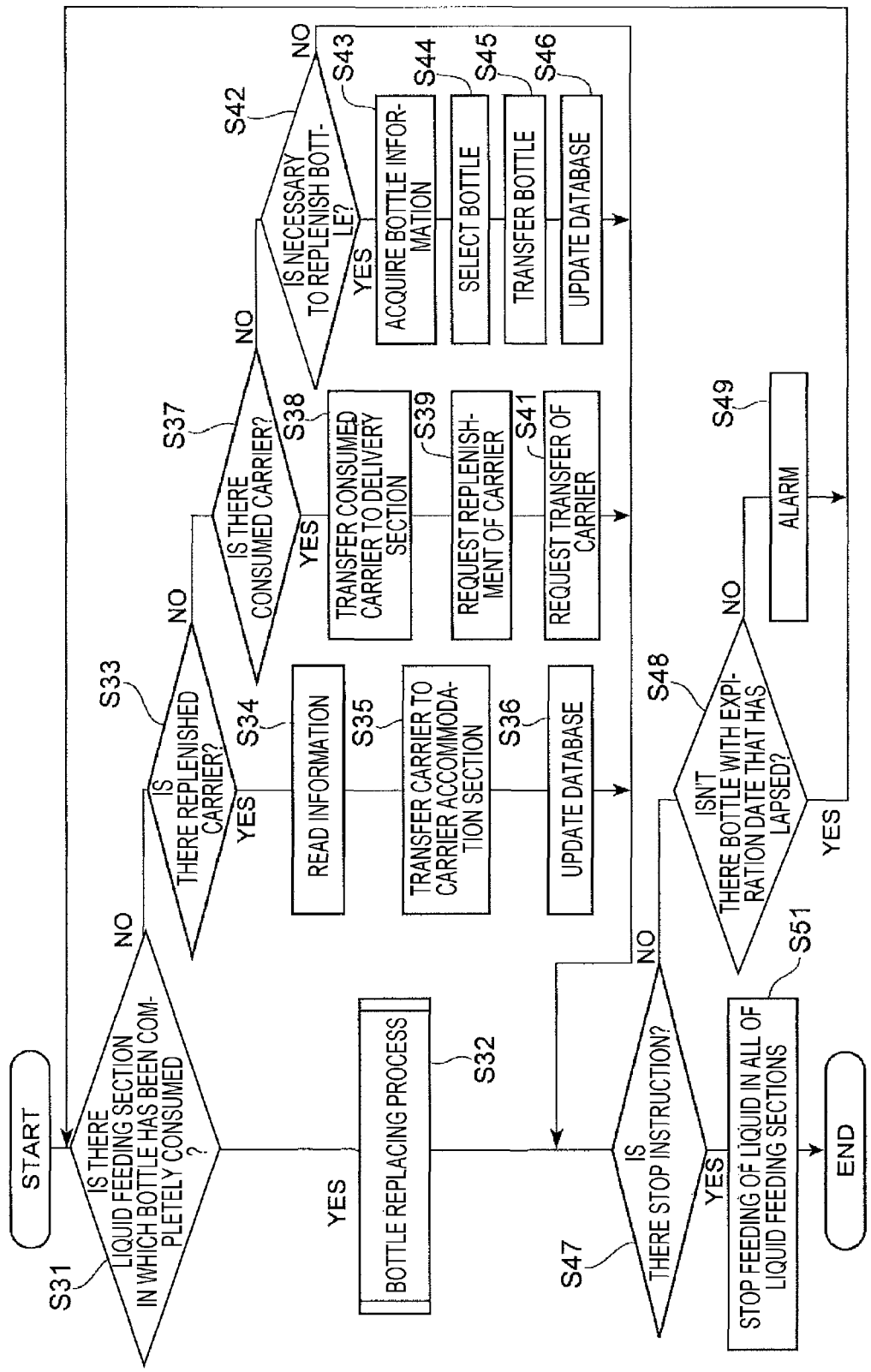
FIG. 10 is a flowchart illustrating a procedure of continuing a supply of a processing liquid.

As illustrated in FIG. 10, the control device 100 first performs step S31. In step S31, the liquid feeding controller 117 checks whether the processing liquid bottle 80 in any one of the liquid feeding sections 14 has been completely consumed. When the processing liquid bottle 80 has been completely used, it means that the liquid level detected by the liquid level sensor 27 has reached the level at which the feeding of liquid is completed.

When it is determined in step S31 that the processing liquid bottle 80 in any one of the liquid feeding sections 14 has been completely consumed, the control device 100 performs step S32. Step S32 includes a process of replacing the processing liquid bottle 80 in the liquid feeding section 14 in which the processing liquid bottle 80 has been completely consumed (hereinafter, referred to as a "replacement target liquid feeding section 14") (hereinafter, referred to as a "bottle replacing process").

Figure 11:
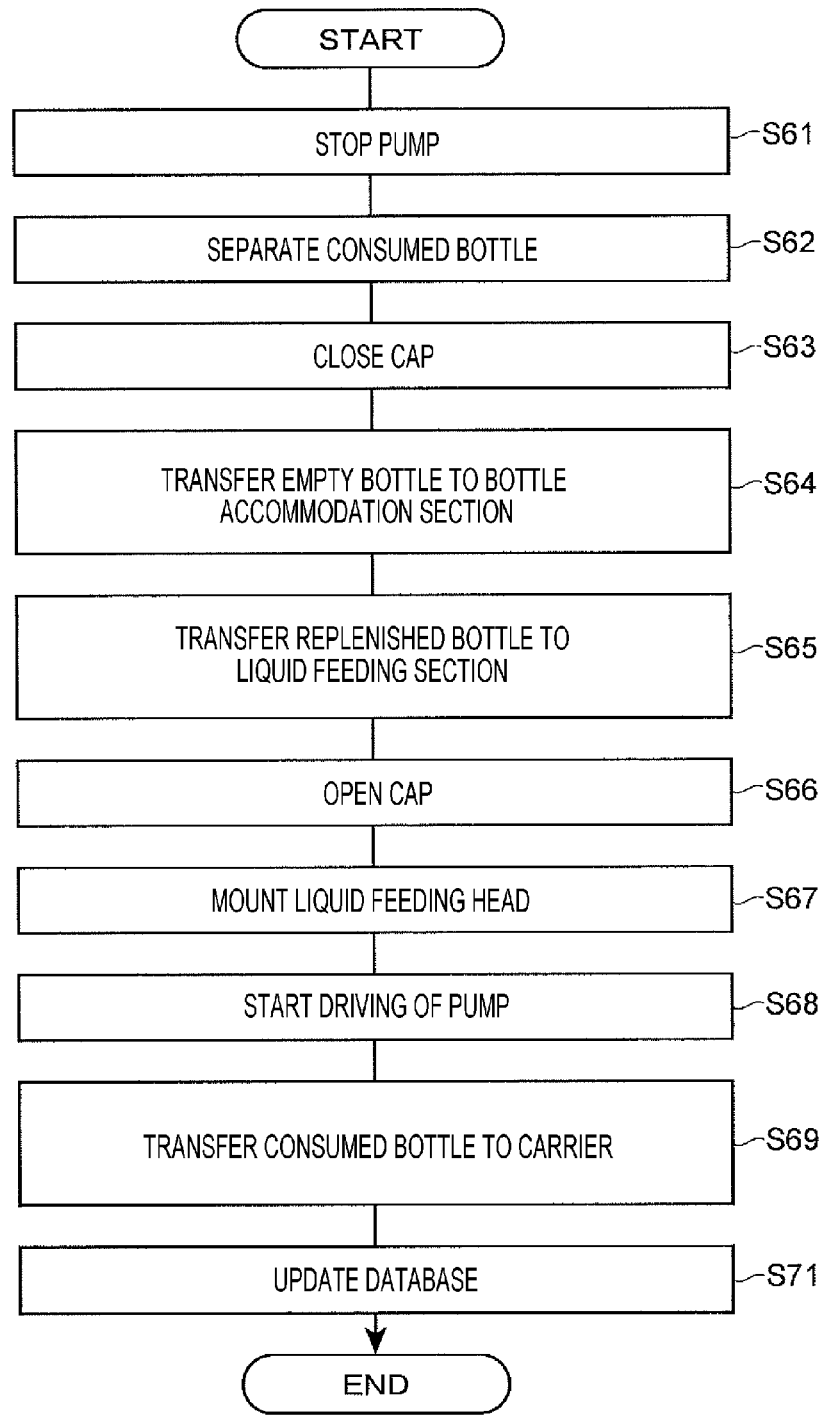
FIG. 11 is a flowchart illustrating a procedure of a bottle replacing process.
Figure 12A:
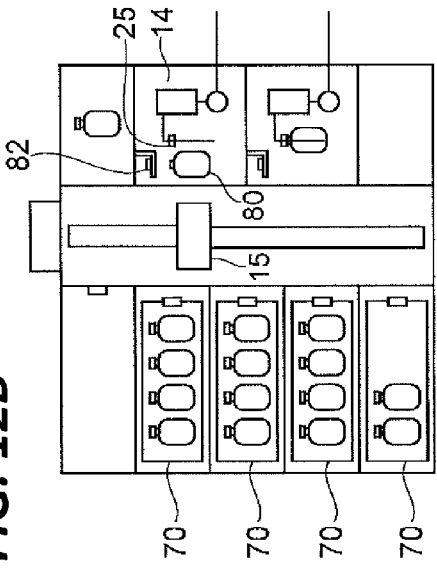
FIGS. 12A to 12D are schematic views illustrating states of the processing liquid supply apparatus during a replacement of a processing liquid bottle.
Figure 12B:
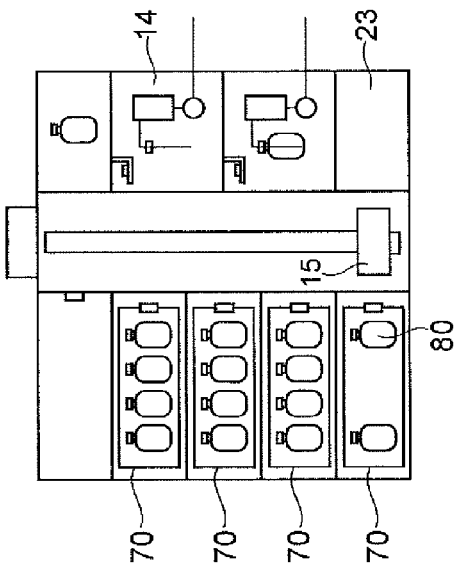
Figure 12C:
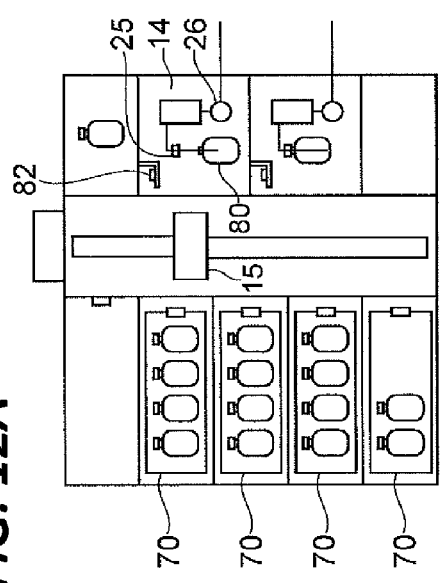

FIG. 11 is a flowchart illustrating the bottle replacing process in step S32. As illustrated in FIG. 11, first, the control device 100 sequentially performs steps S61, S62, S63, and S64. In step S61, the liquid feeding controller 117 controls the replacement target liquid feeding section 14 to switch the ON state of the pump 26 to the OFF state. In step S62, the head attachment/detachment controller 116 controls the transfer unit 15 to detach the liquid feeding head 25 from the consumed processing liquid bottle 80. For example, the head attachment/detachment controller 116 controls the transfer unit 15 to move the consumed processing liquid bottle 80 down away from the liquid feeding head 25 (see FIG. 12A). In step S63, the cap opening/closing controller 115 controls the transfer unit 15 to close the cap 82 of the consumed processing liquid bottle 80. For example, the cap opening/closing controller 115 controls the transfer unit 15 to place the consumed processing liquid bottle 80 below the cap 82 held by the opening/closing jig 24 of the replacement target liquid feeding section 14, and then, move the processing liquid bottle 80 up toward the cap 82 (see FIG. 12B). In step S64, the transfer controller 114 controls the transfer unit 15 to transfer the consumed processing liquid bottle 80 from the replacement target liquid feeding section 14 to an empty bottle accommodation section 23 (see FIG. 12C).

Next, the control device 100 sequentially performs steps S65, S66, S67, and S68. In step S65, the transfer controller 114 controls the transfer unit 15 to transfer a processing liquid bottle 80 from the replenished bottle accommodation unit 22 to the replacement target liquid feeding section 14. In step S66, the cap opening/closing controller 115 controls the transfer unit 15 to open the cap 82 of the processing liquid bottle 80 transferred to the replacement target liquid transfer unit 14 (similar to step S22). In step S67, the head attachment/detachment controller 116 controls the transfer unit 15 to mount the liquid feeding head 25 on the processing liquid bottle 80 from which the cap 82 has been detached in step S66 (similar to step S23). In step S68, the liquid feeding controller 117 controls the replacement target liquid feeding section 14 to switch the OFF state of the pump 26 to the ON state.

Figure 12D:
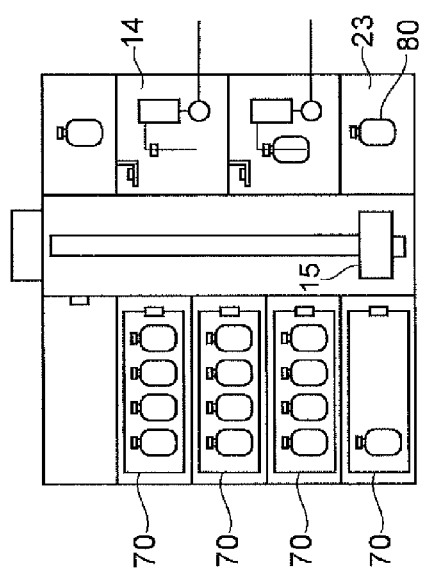

Next, the control device 100 sequentially performs steps S69 and S71. In step S69, the transfer controller 114 controls the transfer unit 15 to transfer the consumed processing liquid bottle 80 from the empty bottle accommodation section 23 and accommodate the processing liquid bottle 80 in the carrier 70 of the carrier accommodation section 12 (FIG. 12D). In step S71, the bottle data update unit 112 updates the contents of the bottle database 150 according to the transfer of the processing liquid bottle 80 in step S69. Then, the bottle replacing process in step S32 is completed.

Referring back to FIG. 10, when it is determined in step S31 that the processing liquid bottles 80 in all of the liquid feeding sections 14 have not completely consumed, the control device 100 performs step S33. In step S33, the bottle data update unit 112 checks whether a carrier 70 for the replenishment is placed in the delivery section 11.

When it is determined in step S33 that the carrier 70 for the replenishment is placed in the delivery section 11, the control device 100 sequentially performs steps S34, S35, and S36. In step S34, the bottle data update unit 112 acquires the information held by the information holding unit 71 of the carrier 70 from the reading unit 21. In step S35, the transfer controller 114 controls the transfer unit 15 to transfer the carrier 70 from the delivery section 11 to any one of the carrier accommodation sections 12. In step S36, the bottle data update unit 112 updates the contents of the bottle database 150 according to the transfer of the carrier 70 in step S35.

When it is determined in step S33 that the carrier 70 for the replenishment is not placed in the delivery section 11, the control device 100 performs step S37. In step S37, the transfer controller 114 checks whether there exists a consumed carrier 70 (a carrier 70 in which all of the processing liquid bottles 80 have been completely consumed).

When it is determined in step S37 that there exists the consumed carrier 70, the control device 100 sequentially performs steps S38, S39, and S41. In step S38, the transfer controller 114 controls the transfer unit 15 to transfer the consumed carrier 70 from the carrier accommodation section 12 to the delivery section 11. In step S39, the carrier replenishment requesting unit 119 transmits a signal for requesting a replenishment of a carrier 70 to the replenishment request acquisition unit 133 of the second controller 130. In step S41, the outward transfer requesting unit 118 transmits a signal for requesting a transfer of the consumed carrier 70 to the carrier storage apparatus 30, to the third controller 140. In response, the third controller 140 controls the automatic transfer device 50 to transfer the consumed carrier 70 from the delivery section 11 of the processing liquid supply apparatus 10 to the delivery section 31 of the carrier storage apparatus 30.

When it is determined in step S37 that there exists no consumed carrier 70, the control device 100 performs step S42. In step S42, the transfer controller 114 checks whether it is necessary to replenish a processing liquid bottle 80 in the replenished bottle accommodation section 22. For example, the transfer controller 114 determines that the replenishment of a processing liquid bottle 80 is necessary, when the number of processing liquid bottles 80 in the replenished bottle accommodation section 22 is smaller than a predetermined number.

When it is determined in step S42 that the replenishment of a processing liquid bottle 80 is necessary in the replenished bottle accommodation section 22, the control device 100 sequentially performs steps S43, S44, S45, and S46. In step S43, the bottle selection unit 113 refers to the information stored in the bottle database 150, and acquires information on a type and an expiration date of a processing liquid accommodated in a processing liquid bottle 80 of the carrier 70. In step S44, the bottle selection unit 113 selects a processing liquid bottle 80 to be taken out from the carrier 70, based on the information acquired in step S43 (similar to step S06). In step S45, the transfer controller 114 controls the transfer unit 15 to take the processing liquid bottle 80 selected in step S44 out from the carrier 70, and transfer the processing liquid bottle 80 to the replenished bottle accommodation section 22. In step S46, the bottle data update unit 112 updates the contents of the bottle database 150 according to the transfer of the processing liquid bottle 80 in step S45.

After steps S32, S36, S41, and S46, the control device 100 performs step S47. The control device 100 performs steps S47 even when it is determined that the replenishment of a processing liquid bottle 80 is necessary in the replenished bottle accommodation section 22. In step S47, the instruction acquisition unit 111 checks whether a stop instruction has been made.

When it is determined in step S47 that no stop instruction has been made, the control device 100 performs step S48. In step S48, the expiration date checking unit 121 refers to the information stored in the bottle database 150, and checks whether there exists a processing liquid bottle 80 of which processing liquid has an expiration date that has lapsed in the processing liquid supply apparatus 10.

When it is determined in step S48 that there exists a processing liquid bottle 80 of which processing liquid has an expiration date that has lapsed, the control device 100 performs step S49. In step S49, the alarm switching unit 122 controls the notification device 60 to switch the normal state to the alarm state. Then, the control device 100 returns the process to step S31. When it is determined in step S48 that there exists no processing liquid bottle 80 of which processing liquid has an expiration date that has lapsed, the control device 100 returns the process to step S31 without performing step S49.

Thereafter, the supply of the processing liquid from the processing liquid supply apparatus 10 to the substrate processing apparatus 90 is continued while replacing the processing liquid bottle 80 in the liquid feeding section 14 as necessary, until the stop command is input. While the processing liquid bottle 80 is completely consumed after being placed in the liquid feeding section 14 (i.e., while it is determined that the processing liquid bottles 80 in all of the liquid feeding sections 14 haven not been completely consumed), at least one of the following processes is performed as necessary: transferring another processing liquid bottle 80 between the carrier 70 of the carrier accommodation section 12 and the carrier storage apparatus 30; and transferring a carrier 70 between the delivery section 11 and the carrier accommodation section 12.

When it is determined in step S47 that the stop instruction has been made, the control device 100 performs step S51. In step S51, the liquid feeding controller 117 controls all of the liquid feeding sections 14 to switch the OFF state of the pump 26 to the ON state. Then, the procedure for continuing the supply of processing liquid is completed.

(Carrier Storing Procedure)

Subsequently, a procedure for storing carriers 70 in the carrier storage apparatus 30 will be described. As illustrated in FIG. 13, the control device 100 first performs step S81. In step S81, the replenishment request acquisition unit 133 checks whether a signal for requesting a replenishment of a carrier 70 has been received.

When it is determined in step S81 that the signal for requesting a replenishment of a carrier 70 has been received, the control device 100 sequentially performs steps S82, S83, S84, and S85. In step S82, the transfer controller 134 controls the transfer unit 36 to replace the processing liquid bottle 80 between the carrier 70 and another carrier 70, in order to bring a plurality of processing liquid bottles 80 in a carrier 70 to be sent to the processing liquid supply apparatus 10 into a state of accommodating a processing liquid that matches the signal acquired from the carrier replenishment requesting unit 119. At this time, the transfer controller 134 may control the transfer unit 36 to transfer the processing liquid bottle 80 via the bottle accommodation sections 35. In step S83, the bottle data update unit 132 updates the contents of the bottle database 150 according to the transfer of the processing liquid bottle 80 in step S82. In step S84, the transfer controller 134 controls the transfer unit 36 to transfer a carrier 70 for the replenishment (a carrier 70 to be sent to the processing liquid supply apparatus 10) from the carrier accommodation section 34 to the delivery section 31. In step S85, the outward transfer requesting unit 135 transmits a signal for requesting a transfer of the carrier 70 for the replenishment to the processing liquid supply apparatus 10, to the third controller 140. In response, the third controller 140 controls the automatic transfer device 50 to transfer the carrier 70 for the replenishment from the delivery section 31 of the carrier storage apparatus 30 to the delivery section 11 of the processing liquid supply apparatus 10.

When it is determined in step S81 that the signal for requesting a replenishment of a carrier 70 has not been received, the control device 100 performs step S86. In step S86, the bottle data update unit 132 checks whether a carrier 70 is placed in the carry-in section 32.

When it is determined in step S86 that a carrier 70 is placed in the carry-in section 32, the control device 100 sequentially performs steps S87, S88, and S89. In step S87, the bottle data update unit 132 acquires the information held by the information holding unit 71 of the carrier 70 from the reading unit 41. In step S88, the transfer controller 134 controls the transfer unit 36 to transfer the carrier 70 from the carry-in section 32 to any one of the carrier accommodation sections 34. In step S89, the data of the processing liquid bottles 80 in the new carrier 70 (the carrier 70 transferred in step S88) is registered in the bottle database 150 according to the data read in step S87.

When it is determined in step S86 that a carrier 70 is not placed in the carry-in section 32, the control device 100 performs step S91. In step S91, the bottle data update unit 132 checks whether a consumed carrier 70 is placed in the delivery section 31.

When it is determined in step S91 that a consumed carrier 70 is placed in the delivery section 31, the control device 100 sequentially performs steps S92, S93, and S94. In step S92, the bottle data update unit 132 acquires the information held by the information holding unit 71 of the carrier 70 from the reading unit 39. In step S93, the transfer controller 134 controls the transfer unit 36 to transfer the carrier 70 from the delivery section 31 to the carry-out section 33. In step S94, the bottle data update unit 132 updates the contents of the bottle database 150 according to the transfer of the carrier 70 in step S93. For example, the bottle data update unit 132 deletes the information on the processing liquid bottle 80 in the carrier 70 transferred in step S93 from the bottle database 150.

After steps S85, S89, and S94, the control device 100 performs step S95. The control device 100 performs step S95 even when it is determined in step S91 that no consumed carrier 70 is placed in the delivery section 31. In step S95, the instruction acquisition unit 131 checks whether a stop instruction has been made.

When it is determined in step S95 that no stop instruction has been made, the control device 100 performs step S96. In step S96, the expiration date checking unit 136 refers to the information stored in the bottle database 150, and checks whether there exists a processing liquid bottle 80 of which processing liquid has an expiration date that has lapsed in the carrier storage apparatus 30.

When it is determined in step S96 that there exists a processing liquid bottle 80 of which processing liquid has an expiration date that has lapsed, the control device 100 performs step S97. In step S97, the alarm switching unit 137 controls the notification device 60 to switch the normal state to the alarm state. Then, the control device 100 returns the process to step S81. When it is determined in step S96 that there exists no processing liquid bottle 80 of which processing liquid has an expiration date that has lapsed, the control device 100 returns the process to step S81 without performing step S97. Then, the storing of a carrier 70 is continued while preparing a carrier 70 for a replenishment, receiving a new carrier 70, and sending out a consumed carrier 70 as necessary, until a stop instruction is made.

When it is determined in step S95 that the stop instruction has been made, the control device 100 completes the procedure for storing carriers 70.

Effects of Embodiment

As described above, the processing liquid supply system 1 includes: the processing liquid supply apparatus including the carrier accommodation section 12 that accommodates a carrier 70 accommodating a plurality of processing liquid bottles 80, the bottle accommodation section 13 that accommodates a processing liquid bottle 80 taken out from the carrier 70, a liquid feeding section 14 that feeds a processing liquid from the processing liquid bottle 80 taken out from the carrier 70 to the substrate processing apparatus 90, and the transfer unit 15 that transfers the processing liquid bottle 80 among the carrier accommodation section 12, the bottle accommodation section 13, and the liquid feeding section 14; and the control device 100 configured to control the transfer unit 15 to take a processing liquid bottle 80 out from the carrier 70 of the carrier accommodation section 12 and transfer the processing liquid bottle 80 to the bottle accommodation section 13, control the transfer unit 15 to transfer the processing liquid bottle 80 from the bottle accommodation section 13 to the liquid feeding section, and control the transfer unit 15 to transfer a consumed processing liquid bottle 80 from the liquid feeding section 14 and accommodate the consumed processing liquid bottle 80 in the carrier 70 of the carrier accommodation section 12.

According to the processing liquid supply system 1, since the processes of taking the processing liquid bottle 80 out from the carrier 70, placing the processing liquid bottle 80 in the liquid feeding section, and returning the consumed processing liquid bottle 80 to the carrier 70 are automatically performed, it is possible to replenish and retrieve a processing liquid bottle 80 in units of carriers 70. As a result, the frequency of performing the work for replenishing and retrieving a processing liquid bottle 80 is reduced. Further, a buffering is performed in units of processing liquid bottles 80 using the bottle accommodation section 13, so that swiftness may be maintained in replacing a processing liquid bottle 80 in the liquid feeding section 14. Accordingly, the present disclosure is effective in reducing the burden of the work for replenishing and retrieving a processing liquid bottle 80 in processing substrates.

The processing liquid supply apparatus 10 may further include the delivery section 11 that delivers a carrier 70, and the control device 100 may be configured to further control the transfer unit 15 to transfer the carrier 70 placed in the delivery section 11 to the carrier accommodation section 12, and control the transfer unit 15 to transfer a carrier 70 accommodating a consumed processing liquid bottle 80 from the carrier accommodation section 12 to the delivery section 11. In this case, the work for delivering a carrier 70 in the processing liquid supply apparatus 10 is simplified. The simplification of the work for delivering a carrier 70 may also contribute to the automation of the work. Accordingly, the present disclosure is effective in further reducing the burden of the work for replacing a processing liquid bottle 80.

The control device 100 may control the transfer unit 15 to, while a processing liquid bottle 80 is completely consumed after being placed in the liquid feeding section 14, transfer another processing liquid bottle 80 between the carrier 70 of the carrier accommodation section 12 and the bottle accommodation section 13. In this case, a buffering is performed in units of processing liquid bottles 80 while the processing liquid bottle 80 is completely consumed after being placed in the liquid feeding section 14, so that swiftness may be further reliably maintained in replacing a processing liquid bottle 80 in the liquid feeding section 14.

The processing liquid supply apparatus 10 may include a plurality of liquid feeding sections 14, and the transfer unit 15 may be configured to allow a range in which a processing liquid bottle 80 can be transferred to include the plurality of liquid feeding sections 14. In this case, since the plurality of liquid feeding systems share the transfer unit 15, the configuration of the apparatus may be simplified.

The control device 100 may be configured to further control the transfer unit 15 to open and close the cap 82 of the processing liquid bottle 80 in the liquid feeding section 14. In this case, since the plurality of liquid feeding systems share at least a portion of the configuration for opening and closing the cap 82, the configuration of the apparatus may be simplified.

The liquid feeding section 14 may include the liquid feeding head 25 for feeding a processing liquid from a processing liquid bottle 80, and the control device 100 may be configured to further control the transfer unit 15 to mount the liquid feeding head 25 on the processing liquid bottle 80.

In this case, since the plurality of liquid feeding systems share at least a portion of the configuration for mounting the liquid feeding head 25, the configuration of the apparatus may be further simplified.

The carrier 70 may include the information holding unit 71 that holds information on a processing liquid accommodated in a processing liquid bottle 80, and the control device 100 may acquire information on a type of a processing liquid accommodated in a processing liquid bottle 80 based on the information held by the information holding unit 71, and select a processing liquid bottle 80 to be taken out from the carrier 70. In this case, a high efficiency may be implemented in transferring a processing liquid bottle 80 in the processing liquid supply apparatus 10 using the information held in the information holding unit 71.

The control device 100 may acquire information on an expiration date of a processing liquid accommodated in a processing liquid bottle 80 based on the information held by the information holding unit 71, and select a processing liquid bottle 80 to be taken out from the carrier 70 in a way that a processing liquid bottle 80 of which processing liquid has a relatively early expiration date is preferentially transferred to the liquid feeding section 14. In this case, it is possible to prevent the lapse of an expiration date of a processing liquid.

The processing liquid supply system may further include the notification device 60 that performs a switching between the normal state indicating that expiration dates of processing liquids of all processing liquid bottles 80 have not lapsed, and the alarm state indicating that an expiration date of a processing liquid of at least one processing liquid bottle 80 has lapsed, and the control device 100 may be configured to further control the notification device 60 to switch the normal state to the alarm state when there exists a processing liquid bottle 80 of which processing liquid has an expiration date that has lapsed. In this case, a processing liquid with an expiration date that has lapsed is prevented from being consumed, so that the reliability may be further improved.

The processing liquid supply apparatus 10 may further include the housing that includes the carrier accommodation sections 12, the bottle accommodation sections 13, the liquid feeding sections 14, and the transfer unit 15, and the temperature regulator 17 that regulates a temperature inside the housing 16. In this case, the temperature of a processing liquid may be managed using the simple configuration in which processing liquid bottles are intensively arranged in the housing 16 of the processing liquid supply apparatus 10.

The processing liquid supply system 1 may further include the carrier storage apparatus 30 that stores a plurality of carriers 70, and the automatic transfer device 50 that transfers a carrier 70 between the carrier storage apparatus 30 and the processing liquid supply apparatus 10. In this case, the carrier storage apparatus 30 that accommodates a plurality of carriers 70 is interposed between the supply source of a carrier 70 and the processing liquid supply apparatus 10, so that the frequency of the work for replenishing and retrieving a carrier 70 may be further reduced.

The carrier storage apparatus 30 may include the plurality of carrier accommodation sections 34 that accommodate a plurality of carriers 70, respectively, the bottle accommodation sections 35 that each accommodates a processing liquid bottle 80 taken out from a carrier 70, and the transfer unit 36 that transfers a processing liquid bottle 80 between the carrier accommodation section 34 and the bottle accommodation section 35, and the control device 100 may be configured to further control the transfer unit 36 to replace a processing liquid bottle 80 between the carrier 70 and another carrier, in order to bring a plurality of processing liquid bottles 80 in the carrier 70 to be sent to the processing liquid supply apparatus 10 into a state of accommodating a processing liquid suitable for the processing liquid supply apparatus 10. In this case, it is possible to implement both the reduction in frequency of the work for replenishing and retrieving a processing liquid bottle 80 and the less waste in supply of a processing liquid bottle 80.

While the embodiment of the present disclosure has been described, the present disclosure is not necessarily limited to the embodiment, and various modifications may be made in the scope that does not depart from the gist of the present disclosure. The substrate to be processed in the substrate processing apparatus 90 is not limited to a semiconductor wafer, and may be, for example, a glass substrate, a mask substrate, a flat panel display (FPD).

Below are appendices that set forth the embodiment described above.

Appendix 1.

A processing liquid supply system comprising:
a processing liquid supply apparatus including
a first carrier accommodation section that accommodates a carrier accommodating a plurality of processing liquid bottles,
a first bottle accommodation section that accommodates a processing liquid bottle taken out from the carrier,
a liquid feeding section that feeds a processing liquid to a substrate processing apparatus from the processing liquid bottle taken out from the carrier, and
a first transfer unit that transfers the processing liquid bottle among the first carrier accommodation section, the first bottle accommodation section, and the liquid feeding section; and
a control device configured to control the first transfer unit to take a processing liquid bottle out from the carrier of the first carrier accommodation section and transfer the processing liquid bottle to the first bottle accommodation section, control the first transfer unit to transfer the processing liquid bottle from the first bottle accommodation section to the liquid feeding section, and control the first transfer unit to transfer the consumed processing liquid bottle from the liquid feeding section and accommodate the consumed processing liquid bottle in the carrier of the first carrier accommodation section.

Appendix 2.

The processing liquid supply apparatus according to Appendix 1, further comprising:
a first delivery section that delivers the carrier,
wherein the controller is configured to control the first transfer unit to transfer the carrier placed in the first delivery section to the first carrier accommodation section, and control the first transfer unit to transfer the carrier accommodating the consumed processing liquid bottle from the first carrier accommodation section to the first delivery section.

Appendix 3.

The processing liquid supply system according to Appendix 1, wherein the controller controls the first transfer unit to, while the processing liquid bottle is completely consumed after being placed in the liquid feeding section, transfer another processing liquid bottle between the carrier of the first carrier accommodation section and the first bottle accommodation section.

Appendix 4.

The processing liquid supply system according to Appendix 1, wherein the processing liquid supply apparatus includes a plurality of liquid feeding sections, and the first transfer unit is configured to allow a range in which the processing liquid bottle can be transferred, to include the plurality of liquid feeding sections.

Appendix 5.

The processing liquid supply system according to Appendix 4, wherein the controller is configured to further control the first transfer unit to open and close a cap of the processing liquid bottle in the liquid feeding section.

Appendix 6.

The processing liquid supply system according to Appendix 5, wherein the liquid feeding section includes a liquid feeding head for feeding the processing liquid from the inside of the processing liquid bottle, and the controller is configured to further control the first transfer unit to mount the liquid feeding head on the processing liquid bottle.

Appendix 7.

The processing liquid supply system according to Appendix 2, wherein the carrier includes an information holding unit that holds information on the processing liquid accommodated in the processing liquid bottle, and the controller acquires information on a type of the processing liquid accommodated in the processing liquid bottle based on the information held by the information holding unit, and selects the processing liquid bottle to be taken out from the carrier based on the type of the processing liquid.

Appendix 8.

The processing liquid supply system according to Appendix 7, wherein the controller acquires information on an expiration date of the processing liquid accommodated in the processing liquid bottle based on the information held by the information holding unit, and selects the processing liquid bottle to be taken out from the carrier in a way that the processing liquid bottle of which processing liquid has a relatively earlier expiration date is preferentially transferred to the liquid feeding section.

Appendix 9.

The processing liquid supply system according to Appendix 8, further comprising:

a notification device that performs a switching between a normal state indicating that expiration dates of processing liquids of all of the processing liquid bottles have not lapsed, and an alarm state indicating that an expiration date of a processing liquid of at least one of the processing liquid bottles has lapsed, and the controller is configured to further control the notification device to switch the normal state to the alarm state when there exists the processing liquid bottle of which processing liquid has an expiration date that has lapsed.

Appendix 10.

The processing liquid supply system according to Appendix 1, wherein the processing liquid supply apparatus further includes a housing that includes the first carrier accommodation section, the first bottle accommodation section, the liquid feeding section, and the first transfer unit, and a temperature regulator that regulates a temperature inside the housing.

Appendix 11.

The processing liquid supply system according to Appendix 1, further comprising:

a carrier storage apparatus that stores a plurality of carriers, and an automatic transfer device that transfers a carrier between the carrier storage apparatus and the processing liquid supply apparatus.

Appendix 12.

The processing liquid supply system according to Appendix 11, wherein the carrier storage apparatus includes a plurality of second carrier accommodation sections that accommodates the plurality of carriers, respectively, a second bottle accommodation section that accommodates the processing liquid bottle taken out from the carrier, and a second transfer unit that transfers the processing liquid bottle between the second carrier accommodation section and the second bottle accommodation section, and the controller is configured to further control the second transfer unit to replace the processing liquid bottle between the carrier and another carrier, in order to bring the plurality of processing liquid bottles in the carrier to be sent to the processing liquid supply apparatus into a state of accommodating a processing liquid suitable for the processing liquid supply apparatus.

Appendix 13.

A processing liquid supply apparatus comprising:

a first carrier accommodation section configured to accommodate a carrier accommodating a plurality of processing liquid bottles;

a first bottle accommodation section configured to accommodate a processing liquid bottle taken out from the carrier;

a liquid feeding section configured to feed a processing liquid from the processing liquid bottle taken out from the carrier to a substrate processing apparatus; and a first transfer unit configured to transfer the processing liquid bottle among the first carrier accommodation section, the first bottle accommodation section, and the liquid feeding section.

Appendix 14.

A carrier storage apparatus comprising:

a second carrier accommodation section configured to accommodate a plurality of carriers each accommodating a plurality of processing liquid bottles;

a second bottle accommodation section configured to accommodate a processing liquid bottle taken out from the carrier;

a second transfer unit configured to transfer the processing liquid bottle between the second carrier accommodation section and the second bottle accommodation section; and a second delivery section configured to deliver the carrier between the carrier storage apparatus and a processing liquid supply apparatus that supplies a processing liquid to a substrate processing apparatus.

DESCRIPTION OF SYMBOLS

1: processing liquid supply system
10: processing liquid supply apparatus
11: delivery section (first delivery section)
12: carrier accommodation section (first carrier accommodation section)
13: bottle accommodation section (first bottle accommodation section)
14: liquid feeding section
15: transfer unit (first transfer unit)
16: housing
17: temperature regulator
25: liquid feeding head
30: carrier storage apparatus
34: carrier accommodation section (second carrier accommodation section)
35: bottle accommodation section (second bottle accommodation section)

36: transfer unit (second transfer unit)
50: automatic transfer device
60: notification device
70: carrier
71: information holding unit
80: processing liquid bottle
82: cap
90: substrate processing apparatus
100: control device

What is claimed is:

1. A processing liquid supply system comprising:
    a carrier storage apparatus including a plurality of carriers, each carrier accommodating a plurality of processing liquid bottles;
    a processing liquid supply apparatus including
        a first carrier accommodation section that accommodates a carrier taken out from the carrier storage apparatus,
        a first bottle accommodation section that accommodates a processing liquid bottle taken out from the carrier,
        a liquid feeding section that feeds a processing liquid to a substrate processing apparatus from the processing liquid bottle taken out from the carrier, and
        a first transfer arm that transfers the processing liquid bottle among the first carrier accommodation section, the first bottle accommodation section, and the liquid feeding section;
    an overhead hoist configured to transfer the plurality of carriers between the carrier storage apparatus and the processing liquid supply apparatus; and
    a controller configured to control an overall operation of the processing liquid supply system,
    wherein the controller is configured to:
    control the first transfer arm to take a processing liquid bottle out from the carrier accommodated in the first carrier accommodation section and transfer the processing liquid bottle to the first bottle accommodation section, control the first transfer arm to transfer the processing liquid bottle from the first bottle accommodation section to the liquid feeding section, and after the processing liquid bottle is consumed, control the first transfer arm to transfer the consumed processing liquid bottle from the liquid feeding section and accommodate the consumed processing liquid bottle in the carrier accommodated in the first carrier accommodation section.

2. The processing liquid supply system according to claim 1, wherein the processing liquid supply apparatus further includes:
    a first delivery section that delivers the carrier,
    wherein the controller is configured to control the first transfer arm to transfer the carrier placed in the first delivery section to the first carrier accommodation section, and control the first transfer arm to transfer the carrier accommodating the consumed processing liquid bottle from the first carrier accommodation section to the first delivery section.

3. The processing liquid supply system according to claim 1, wherein the controller controls the first transfer arm to, while the processing liquid bottle is completely consumed after being placed in the liquid feeding section, transfer another processing liquid bottle between the carrier accommodated in the first carrier accommodation section and the first bottle accommodation section.

4. The processing liquid supply system according to claim 1, wherein the processing liquid supply apparatus includes a plurality of liquid feeding sections, and
    the first transfer arm is configured such that a range capable of transferring the processing liquid bottle includes the plurality of liquid feeding sections.

5. The processing liquid supply system according to claim 4, wherein the controller is configured to further control the first transfer arm to open and close a cap of the processing liquid bottle in the liquid feeding section.

6. The processing liquid supply system according to claim 5, wherein the liquid feeding section includes a liquid feeding head for feeding the processing liquid from the inside of the processing liquid bottle, and
    the controller is configured to further control the first transfer arm to mount the liquid feeding head on the processing liquid bottle.

7. The processing liquid supply system according to claim 2, wherein the carrier includes an information holder that holds information on the processing liquid accommodated in the processing liquid bottle, and
    the controller acquires information on a type of the processing liquid accommodated in the processing liquid bottle based on the information held by the information holder, and selects the processing liquid bottle to be taken out from the carrier based on the type of the processing liquid.

8. The processing liquid supply system according to claim 7, wherein the controller acquires information on an expiration date of the processing liquid accommodated in the processing liquid bottle based on the information held by the information holder, and selects the processing liquid bottle to be taken out from the carrier in such a way that the processing liquid bottle of which processing liquid has a relatively earlier expiration date is preferentially transferred to the liquid feeding section.

9. The processing liquid supply system according to claim 8, further comprising:
    a notifier that performs a switching between a normal state indicating that expiration dates of processing liquids of all of the processing liquid bottles have not lapsed, and an alarm state indicating that an expiration date of a processing liquid of at least one of the processing liquid bottles has lapsed, and
    the controller is configured to further control the notifier to switch the normal state to the alarm state when there exists the processing liquid bottle of which processing liquid has an expiration date that has lapsed.

10. The processing liquid supply system according to claim 1, wherein the processing liquid supply apparatus further includes
    a housing that includes the first carrier accommodation section, the first bottle accommodation section, the liquid feeding section, and the first transfer arm, and
    a temperature regulator that regulates a temperature inside the housing.

11. The processing liquid supply system according to claim 1, wherein the carrier storage apparatus includes
    a plurality of second carrier accommodation sections that accommodates the plurality of carriers, respectively,
    a second bottle accommodation section that accommodates the processing liquid bottle taken out from the carrier, and
    a second transfer arm that transfers the processing liquid bottle between the second carrier accommodation section and the second bottle accommodation section, and the controller is configured to further control the second transfer arm to replace the processing liquid bottle between the carrier and another carrier such that the plurality of processing liquid bottles in the carrier to be sent to the processing liquid supply apparatus accommodate a processing liquid suitable for the processing liquid supply apparatus.

12. A processing liquid supply apparatus comprising:
a plurality of vertically stacked carrier accommodation sections, each carrier accommodation section configured to accommodate a removable carrier from a carrier storage apparatus positioned outside the processing liquid supply apparatus, each carrier configured to simultaneously accommodate a plurality of processing liquid bottles;
a bottle accommodation section configured to accommodate a processing liquid bottle taken out from the carrier positioned in the carrier accommodation section;
a liquid feeding section configured to feed a processing liquid from the processing liquid bottle taken out from the carrier positioned in the carrier accommodation section to a substrate processing apparatus; and
a transfer section separating the carrier accommodation section from the bottle accommodation section and the liquid feeding section, the transfer section including a transfer arm configured to directly transfer the processing liquid bottle among the carrier accommodation section, the bottle accommodation section, and the liquid feeding section,
wherein the bottle accommodation section and the liquid feeding section are vertically arranged with each other.

13. A carrier storage apparatus comprising:
a plurality of vertically stacked carrier accommodation sections, each carrier accommodation section configured to accommodate a removable carrier, each carrier configured to simultaneously accommodate a plurality of processing liquid bottles;
a plurality of vertically stacked bottle accommodation sections, each bottle accommodation section configured to accommodate a processing liquid bottle taken out from the carrier;
a transfer arm configured to transfer the processing liquid bottle between the carrier accommodation sections and the bottle accommodation sections; and
a delivery section positioned above the plurality of carrier accommodation sections and configured to deliver the carrier between carrier storage apparatus and a processing liquid supply apparatus that supplies a processing liquid to a substrate processing apparatus.

* * * * *